(12) United States Patent
Chu et al.

(10) Patent No.: US 12,205,537 B2
(45) Date of Patent: Jan. 21, 2025

(54) DISPLAY DEVICE AND DRIVING METHOD THEREOF

(71) Applicant: BOE TECHNOLOGY GROUP CO., LTD., Beijing (CN)

(72) Inventors: Mingi Chu, Beijing (CN); Ying Han, Beijing (CN); Song Meng, Beijing (CN); Fei Yang, Beijing (CN); Lirong Wang, Beijing (CN); Zhiqiang Dong, Beijing (CN); Tianji Li, Beijing (CN); Jingbo Xu, Beijing (CN); Pan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/004,345

(22) PCT Filed: Dec. 21, 2021

(86) PCT No.: PCT/CN2021/140080
§ 371 (c)(1),
(2) Date: Jan. 5, 2023

(87) PCT Pub. No.: WO2023/115332
PCT Pub. Date: Jun. 29, 2023

(65) Prior Publication Data
US 2024/0242667 A1    Jul. 18, 2024

(51) Int. Cl.
G09G 3/3225    (2016.01)
G09G 3/20    (2006.01)

(52) U.S. Cl.
CPC ......... *G09G 3/3225* (2013.01); *G09G 3/2074* (2013.01); *G09G 2320/064* (2013.01); *G09G 2360/14* (2013.01)

(58) Field of Classification Search
CPC . G06F 2203/041–04114; G06F 3/0421; G06F 3/0412; G06F 2203/04106;
(Continued)

(56) References Cited

U.S. PATENT DOCUMENTS 8,269,695 B2    9/2012    Kasai et al.
9,715,851 B1    7/2017    Song et al.
(Continued)

FOREIGN PATENT DOCUMENTS

CN    101046935 A    10/2007
CN    105070738 A    11/2015
(Continued)

*Primary Examiner* — Sanjiv D. Patel
(74) *Attorney, Agent, or Firm* — Leason Ellis LLP

(57) ABSTRACT

A display device and a driving method thereof. The display device includes a display substrate and at least one optical sensing unit; the display substrate includes a light-emitting region and a plurality of pixel units located in the light-emitting region; wherein the light-emitting region comprises a single-sided light-emitting region and at least one double-sided light-emitting region, and each of the pixel units in the plurality of pixel units comprises a plurality of sub-pixels; and the at least one optical sensing unit corresponds to the at least one double-sided light-emitting region from a non-display side of the display substrate, and configured to sense light emitted by the sub-pixels during operation in the at least one double-sided light-emitting region, and to provide sensing brightness information of the at least one double-sided light-emitting region to perform brightness compensation on the light-emitting region.

16 Claims, 8 Drawing Sheets

(58) Field of Classification Search
CPC .. H10K 59/00–95; H10K 59/60; H10K 59/65; H10K 59/40; G06V 40/1318
See application file for complete search history.

(56) References Cited

U.S. PATENT DOCUMENTS

| | | |
|---|---|---|
| 10,629,118 B2 | 4/2020 | Choi et al. |
| 10,726,784 B2 | 7/2020 | Liu et al. |
| 10,916,194 B2 | 2/2021 | Yang et al. |
| 11,296,155 B2 | 4/2022 | Hu et al. |
| 2016/0086537 A1 | 3/2016 | Shin |
| 2021/0083018 A1* | 3/2021 | Hu ....................... H01L 31/173 |

FOREIGN PATENT DOCUMENTS

| | | |
|---|---|---|
| CN | 106887212 A | 6/2017 |
| CN | 107799069 A | 3/2018 |
| CN | 108122532 A | 6/2018 |
| CN | 109491169 A | 3/2019 |
| CN | 110972506 A | 4/2020 |

* cited by examiner

DISPLAY DEVICE AND DRIVING METHOD THEREOF

This application is a U.S. National Phase Entry of International Application No. PCT/CN2021/140080 filed on Dec. 21, 2021. The present application claims priority to and the benefit of the above-identified application and the above-identified application is incorporated by reference herein in its entirety.

TECHNICAL FIELD

The embodiments of the present disclosure relate to a display device and a driving method of the display device.

BACKGROUND

Organic Light-Emitting Diode (OLED) display panels have advantages of thin thickness, light weight, wide viewing angle, active light-emitting, continuously adjustable light-emitting color, low cost, fast response speed, low energy consumption, low driving voltage, wide operating temperature range, simple production process, high luminous efficiency and flexible display, and the OLED display panels are more and more widely used in the display field such as used in mobile phones, tablet computers, and digital cameras.

SUMMARY

At least some embodiments of the present disclosure provide a display device, which includes: a display substrate, including a light-emitting region and a plurality of pixel units located in the light-emitting region; wherein the light-emitting region includes a single-sided light-emitting region and at least one double-sided light-emitting region, and each of the pixel units in the plurality of pixel units includes a plurality of sub-pixels; and at least one optical sensing unit, corresponding to the at least one double-sided light-emitting region from a non-display side of the display substrate, and configured to sense light emitted by the sub-pixels during operation in the at least one double-sided light-emitting region, and to provide sensing brightness information of the at least one double-sided light-emitting region to perform brightness compensation on the light-emitting region.

For example, the display device provided by some embodiments of the present disclosure further includes: a standard brightness determination unit, configured to determine standard brightness information of the at least one double-sided light-emitting region according to display data of the sub-pixels in the at least one double-sided light-emitting region; a gain determination unit, configured to determine brightness gain data according to the standard brightness information and the sensing brightness information; and a brightness compensation unit, configured to perform brightness compensation on the light-emitting region according to the brightness gain data.

For example, in the display device provided by some embodiments of the present disclosure, the at least one double-sided light-emitting region includes a plurality of double-sided light-emitting regions, the at least one optical sensing unit includes a plurality of optical sensing units, and the plurality of double-sided light-emitting regions correspond to the plurality of optical sensing units one by one.

For example, in the display device provided by some embodiments of the present disclosure, the gain determination unit is configured to determine the brightness gain data according to the standard brightness information and the sensing brightness information, including: the gain determination unit is configured to: determine a plurality of local brightness gain data according to the standard brightness information and the sensing brightness information of the plurality of double-sided light-emitting regions; and use a maximum value or an average value of the plurality of local brightness gain data as the brightness gain data.

For example, in the display device provided by some embodiments of the present disclosure the gain determination unit is configured to determine the brightness gain data according to the standard brightness information and the sensing brightness information, including: the gain determination unit is configured to: determine a plurality of local brightness difference data according to the standard brightness information and the sensing brightness information of the plurality of double-sided light-emitting regions; take a maximum value or an average value of the plurality of local brightness difference data as the brightness difference data; and determine the brightness gain data according to the brightness difference data.

For example, in the display device provided by some embodiments of the present disclosure, the light-emitting region includes a plurality of light-emitting sub-regions corresponding to the plurality of double-sided light-emitting regions one by one; the gain determination unit is configured to determine the brightness gain data according to the standard brightness information and the sensing brightness information, including: the gain determination unit is configured to determine local brightness gain data of the plurality of light-emitting sub-regions according to the standard brightness information and the sensing brightness information of the plurality of double-sided light-emitting regions; the brightness compensation unit is configured to perform brightness compensation on the light-emitting region according to the brightness gain data, including: the brightness compensation unit is configured to perform brightness compensation on the plurality of light-emitting sub-regions respectively according to the local brightness gain data of the plurality of light-emitting sub-regions.

For example, in the display device provided by some embodiments of the present disclosure, the light-emitting region further includes a transition region between adjacent light-emitting sub-regions; the gain determination unit is configured to determine the brightness gain data according to the standard brightness information and the sensing brightness information, further including: the gain determining unit is further configured to determine the local brightness gain data of the transition region according to the local brightness gain data of the adjacent light-emitting sub-regions; the brightness compensation unit is configured to perform brightness compensation on the light-emitting region according to the brightness gain data, further including: the brightness compensation unit is further configured to perform brightness compensation on the transition region according to the local brightness gain data of the transition region.

For example, in the display device provided by some embodiments of the present disclosure, the gain determination unit is configured to determine the brightness gain data according to the standard brightness information and the sensing brightness information, including: the gain determination unit is configured to: determine degradation degree estimation data of each of the sub-pixels in the light-emitting region according to accumulated display information of each of the sub-pixels in the light-emitting region; determine degradation degree calculation data of the sub-pixels in the at least one double-sided light-emitting region according to the standard brightness information and the sensing brightness information of the at least one double-sided light-emitting region; determine degradation degree correction data according to the degradation degree estimation data and the degradation degree calculation data of the sub-pixels in the at least one double-sided light-emitting region; determine the degradation degree calculation data of each of the sub-pixels in the single-sided light-emitting region according to the degradation degree estimation data and the degradation degree correction data of each sub-pixel in the single-sided light-emitting region; and determine individual brightness gain data of each of the sub-pixels in the light-emitting region according to the degradation degree calculation data of each of the sub-pixels in the light-emitting region; the brightness compensation unit is configured to perform brightness compensation on the light-emitting region according to the brightness gain data, including: the brightness compensation unit is configured to respectively perform brightness compensation on each of the sub-pixels in the light-emitting region according to the individual brightness gain data of each of the sub-pixels in the light-emitting region.

For example, the display device provided by some embodiments of the present disclosure further includes: a sensing processor, configured to drive the at least one optical sensing unit to sense the light emitted by the sub-pixels in the at least one double-sided light-emitting region during operation, to obtain the sensing brightness information of the at least one double-sided light-emitting region.

For example, the display device provided by some embodiments of the present disclosure further includes: a bridge circuit board, wherein the at least one optical sensing unit is electrically connected with the sensing processor by the bridge circuit board.

For example, in the display device provided by some embodiments of the present disclosure, in a case that the display device includes a standard brightness determination unit, a gain determination unit, and a brightness compensation unit, the standard brightness determination unit, the gain determination unit, and the brightness compensation unit are arranged in the sensing processor.

For example, the display device provided by some embodiments of the present disclosure further includes: a time controller; wherein in a case that the display device includes a standard brightness determination unit, a gain determination unit and a brightness compensation unit, the standard brightness determination unit, the gain determination unit and the brightness compensation unit are arranged in the time controller.

For example, in the display device provided by some embodiments of the present disclosure, the at least one double-sided light-emitting region includes a plurality of double-sided light-emitting regions, the plurality of double-sided light-emitting regions are uniformly distributed in the light-emitting region.

For example, in the display device provided by some embodiments of the present disclosure, each of the sub-pixels of the plurality of sub-pixels includes a light-emitting element; the light-emitting element in the single-sided light-emitting region includes a first electrode, a first light-emitting functional layer and a second electrode that are stacked in sequence, the first electrode is closer to the non-display side than the second electrode, the first electrode is an opaque electrode, and the second electrode is a transparent electrode; the light-emitting element in the at least one double-sided light-emitting region includes a third electrode, a second light-emitting functional layer and a fourth electrode that are stacked in sequence, the third electrode is closer to the non-display side than the fourth electrode, at least a part of the third electrode is transparent, a transparent portion of the third electrode allows light emitted by the second light-emitting functional layer to pass through and to be emitted to the non-display side, and the fourth electrode is a transparent electrode.

For example, in the display device provided by some embodiments of the present disclosure, for a light-emitting element in any one of the sub-pixels of the single-sided light-emitting region and a light-emitting element in one of the sub-pixels of the at least one double-sided light-emitting region that has a same light-emitting color as any one of the sub-pixels of the single-sided light-emitting region, the second electrode is substantially the same as the fourth electrode, the first light-emitting functional layer is substantially the same as the second light-emitting functional layer, except for the transparent portion, the third electrode is substantially the same as the first electrode; and a value range of a ratio of an area of the transparent portion of the third electrode to an area of the third electrode is 5% to 20%.

At least some embodiments of the present disclosure further provide a driving method of a display device, wherein the display device includes: a display substrate, including a light-emitting region and a plurality of pixel units located in the light-emitting region, wherein the light-emitting region includes a single-sided light-emitting region and at least one double-sided light-emitting region, each of the pixel units in the plurality of pixel units includes a plurality of sub-pixels; and at least one optical sensing unit, corresponding to the at least one double-sided light-emitting region from the non-display side of the display substrate, configured to sense light emitted by the sub-pixels during operation in the at least one double-sided light-emitting region, and to provide the sensing brightness information of the at least one double-sided light-emitting region to perform brightness compensation on the light-emitting region; the driving method includes: controlling the at least one optical sensing unit to sense the light emitted by the sub-pixels in the at least one double-sided light-emitting region during operation, and performing brightness compensation on the light-emitting region based on the sensing brightness information of the at least one double-sided light-emitting region.

For example, in the driving method provided by some embodiments of the present disclosure, the display device further includes: a standard brightness determination unit, configured to determine standard brightness information of the at least one double-sided light-emitting region according to the display data of the sub-pixels in the at least one double-sided light-emitting region; a gain determination unit, configured to determine brightness gain data according to the standard brightness information and the sensing brightness information; and a brightness compensation unit, configured to perform brightness compensation on the light-emitting region according to the brightness gain data; performing brightness compensation on the light-emitting region according to the sensing brightness information of the at least one double-sided light-emitting region includes: determining standard brightness information of the at least one double-sided light-emitting region according to the display data of the sub-pixels in the at least one double-sided light-emitting region; determining brightness gain data according to the standard brightness information and the sensing brightness information; and performing brightness compensation on the light-emitting region according to the brightness gain data.

For example, in the driving method provided by some embodiments of the present disclosure, the at least one double-sided light-emitting region includes a plurality of double-sided light-emitting regions, the at least one optical sensing unit includes a plurality of optical sensing units, and the plurality of double-sided light-emitting regions correspond to the plurality of optical sensing units one by one.

For example, in the driving method provided by some embodiments of the present disclosure, determining the brightness gain data according to the standard brightness information and the sensing brightness information includes: determining a plurality of local brightness gain data according to the standard brightness information and the sensing brightness information of the plurality of double-sided light-emitting regions; and using a maximum value or an average value of the plurality of local brightness gain data as the brightness gain data.

For example, in the driving method provided by some embodiments of the present disclosure, determining the brightness gain data according to the standard brightness information and the sensing brightness information includes: determining a plurality of local brightness difference data according to the standard brightness information and the sensing brightness information of the plurality of double-sided light-emitting regions; taking a maximum value or an average value of the plurality of local brightness difference data as the brightness difference data; and determining the brightness gain data according to the brightness e difference data.

For example, in the driving method provided by some embodiments of the present disclosure, the light-emitting region includes a plurality of light-emitting sub-regions corresponding to the plurality of double-sided light-emitting regions one by one; determining the brightness gain data according to the standard brightness information and the sensing brightness information includes: determining local brightness gain data of the plurality of light-emitting sub-regions according to the standard brightness information and the sensing brightness information of the plurality of double-sided light-emitting regions; performing brightness compensation on the light-emitting region according to the brightness gain data includes: respectively performing brightness compensation on the plurality of light-emitting sub-regions according to the local brightness gain data of the plurality of light-emitting sub-regions.

For example, in the driving method provided by some embodiments of the present disclosure, the light-emitting region further includes a transition region between adjacent light-emitting sub-regions; determining the brightness gain data according to the standard brightness information and the sensing brightness information, further includes: determining the local brightness gain data of the transition region according to the local brightness gain data of the adjacent light-emitting sub-regions; performing brightness compensation on the light-emitting region according to the brightness gain data, further includes: performing brightness compensation on the transition region according to the local brightness gain data of the transition region.

For example, in the driving method provided by some embodiments of the present disclosure, determining the brightness gain data according to the standard brightness information and the sensing brightness information includes: determining degradation degree estimation data of each of the sub-pixels in the light-emitting region according to accumulated display information of each of the sub-pixels in the light-emitting region; determining degradation degree calculation data of the sub-pixels in the at least one double-sided light-emitting region according to the standard brightness information and the sensing brightness information of the at least one double-sided light-emitting region; determining degradation degree correction data according to the degradation degree estimation data and the degradation degree calculation data of the sub-pixels in the at least one double-sided light-emitting region; determining degradation degree calculation data of each of the sub-pixels in the single-sided light-emitting region according to the degradation degree estimation data and the degradation degree correction data of each of the sub-pixels in the single-sided light-emitting region; and determining the individual brightness gain data of each of the sub-pixels in the light-emitting region according to the degradation degree calculation data of each of the sub-pixels in the light-emitting region; performing brightness compensation on the light-emitting region according to the brightness gain data includes: respectively performing brightness compensation on each of the sub-pixels in the light-emitting region according to the individual brightness gain data of each of the sub-pixels in the light-emitting region.

BRIEF DESCRIPTION OF DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

Figure 1:
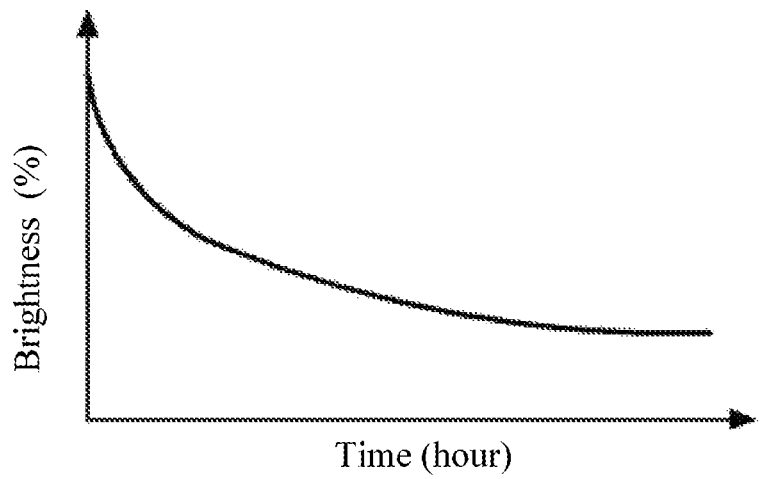
FIG. 1 is a schematic diagram of a life curve of an OLED display unit.

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or a mechanical connection, but may comprise an electrical connection which is direct or indirect. The terms "on," "under," "right," "left" and the like are only used to indicate relative position relationship, and in a case that the position of an object is described as being changed, the relative position relationship may be changed accordingly.

The present disclosure will be described below through several specific embodiments. To keep the following descriptions of the embodiments of the present disclosure clear and concise, detailed descriptions of well-known functions and well-known parts (elements) may be omitted. In a case that any part (element) of an embodiment of the present disclosure appears in more than one drawing, the part (element) is denoted by the same or similar reference numeral in each drawing.

FIG. 1 is a schematic diagram of a lifetime curve of an OLED display unit. As illustrated by FIG. 1, as the display time increases, display brightness of the OLED display unit gradually decreases. With the use of OLED display devices, degradation degrees of all the OLED display units of the OLED display devices are different, abnormal display problems such as uneven brightness of the display screen are likely to be caused, so that the display quality is reduced. Therefore, brightness compensation for the OLED display devices is required.

At least some embodiments of the present disclosure provide a display device. The display device includes a display substrate and at least one optical sensing unit; the display substrate includes a light-emitting region and a plurality of pixel units located in the light-emitting region, the light-emitting region includes a single-sided light-emitting region and at least one double-sided light-emitting region, each pixel unit in the plurality of pixel units includes a plurality of sub-pixels; the at least one optical sensing unit corresponds to the at least one double-sided light-emitting region from the non-display side of the display substrate, senses light emitted by the sub-pixels in the at least one double-sided light-emitting region during operation, and provides sensing brightness information of the at least one double-sided light-emitting region to perform brightness compensation on the light-emitting region.

Some embodiments of the present disclosure further provide a driving method corresponding to the above-mentioned display device.

The display device provided by the embodiments of the present disclosure adopts the double-sided light-emitting design of the display substrate and is matched with the optical sensing unit arranged on the non-display side of the display substrate, so that the display device can obtain the sensing brightness information of the double-sided light-emitting region to perform brightness compensation on the light-emitting region of the display substrate without affecting the display screen, thus abnormal display problems such as uneven brightness caused by degradation of sub-pixels can be improved, thereby improving display quality.

Hereinafter, some embodiments of the present disclosure and their examples will be described in detail below with reference to the accompanying drawings.

Figure 2A:
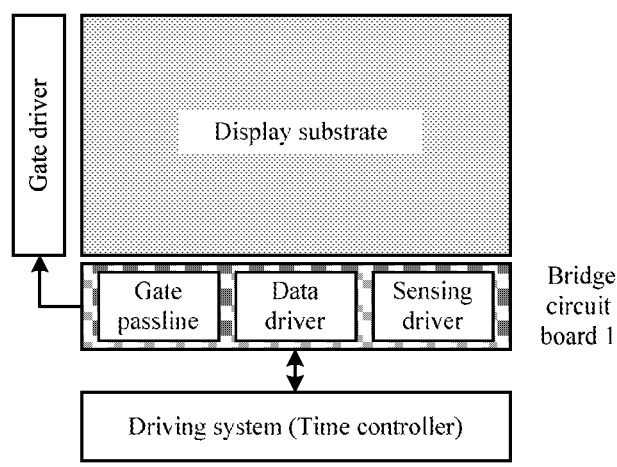
FIG. 2A is a schematic diagram of a front structure of a display device provided by at least some embodiments of the present disclosure.
Figure 2B:
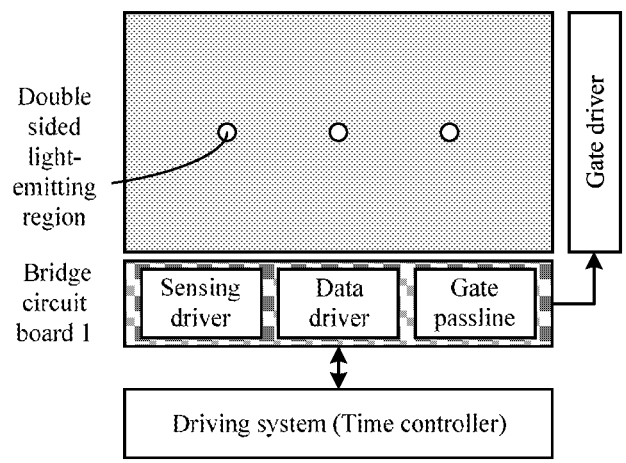
FIG. 2B is a schematic diagram of a rear structure of a display device provided by at least some embodiments of the present disclosure.
Figure 2C:
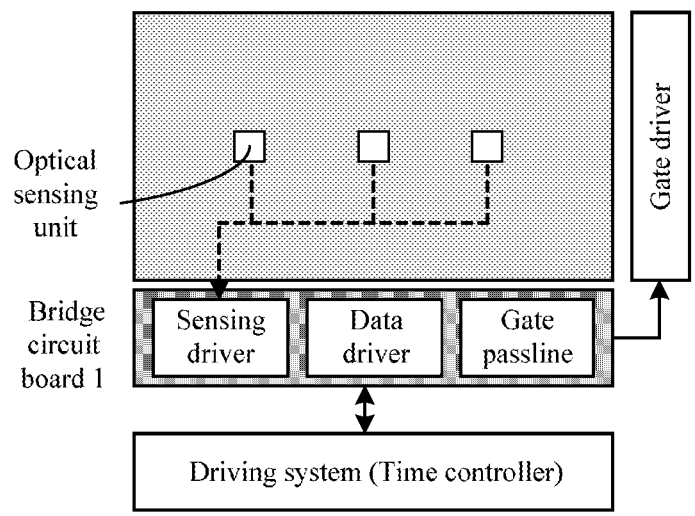
FIG. 2C is a schematic diagram of a rear structure of another display device provided by at least some embodiments of the present disclosure.
Figure 2D:
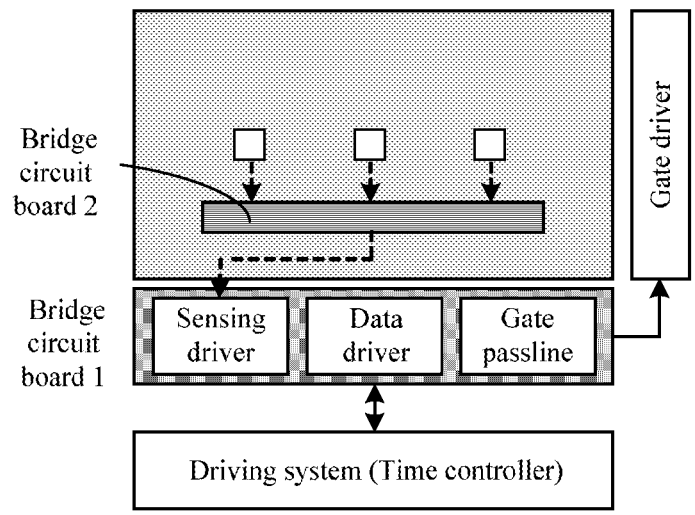
FIG. 2D is a schematic diagram of a rear structure of still another display device provided by at least some embodiments of the present disclosure.
Figure 2E:
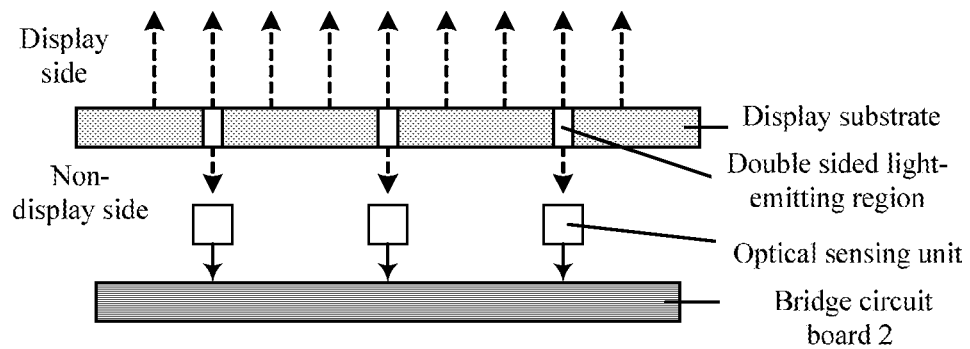
FIG. 2E is a partial cross-sectional structural schematic diagram of a display device provided by at least some embodiments of the present disclosure.

FIG. 2A is a schematic diagram of a front structure of a display device provided by at least some embodiments of the present disclosure, FIG. 2B is a schematic diagram of a rear structure of a display device provided by at least some embodiments of the present disclosure, FIG. 2C is a schematic diagram of a rear structure of another display device provided by at least some embodiments of the present disclosure, FIG. 2D is a schematic diagram of a rear structure of still another display device provided by at least some embodiments of the present disclosure, and FIG. 2E is a partial cross-sectional structural schematic diagram of a display device provided by at least some embodiments of the present disclosure.

For example, as illustrated by FIG. 2A to FIG. 2E, the display device includes a display substrate and at least one optical sensing unit. For example, the display substrate includes a light-emitting region (as shown in gray regions in the display substrate in FIG. 2A to FIG. 2E) and a plurality of pixel units located in the light-emitting region. For example, in the light-emitting region, the plurality of pixel units are arranged in an array.

For example, in some embodiments, as illustrated by FIG. 2B to FIG. 2E, the light-emitting region includes a single-side light-emitting region and at least one double-side light-emitting region (a region in the light-emitting region other than the double-sided light-emitting region is the single-sided light-emitting region). Exemplarily, FIG. 2B to FIG. 2E show a case that the light-emitting region of the display substrate includes three double-sided light-emitting regions; it should be noted that, the embodiments of the present disclosure include but are not limited thereto. For example, the light-emitting regions may also include a greater or lesser number of the double-sided light-emitting regions. For example, shapes and areas of all the double-sided light-emitting regions may be the same or approximately the same respectively, the embodiments of the present disclosure include but are not limited thereto.

For example, in some embodiments, each pixel unit in the light-emitting region includes a plurality of sub-pixels for display. For example, in some examples, the plurality of sub-pixels may include red sub-pixels, green sub-pixels, and blue sub-pixels; for example, in other examples, the plurality of sub-pixels may include red sub-pixels, green sub-pixels, blue sub-pixels, and white sub-pixels. It should be noted that the embodiments of the present disclosure do not limit the number and the types of sub-pixels included in each pixel unit.

For example, in some embodiments, each of the sub-pixels may include a light-emitting element and a pixel circuit for driving the light-emitting element to emit light. For example, in some examples, light-emitting elements in sub-pixels of different colors may emit light of corresponding colors; for example, the light-emitting elements in the red sub-pixels can emit red light, the light-emitting elements in the green sub-pixels can emit green light, the light-emitting elements in the blue sub-pixels can emit blue light, and the light-emitting elements in the white sub-pixels can emit white light. For example, in other examples, the light-emitting elements in the sub-pixels of different colors are all light-emitting elements that can emit white light, in this case, the sub-pixels of different colors further include color filter layers corresponding to different colors; for example, each of the red sub-pixels further includes a red color film layer, the red color film layer is used to convert the white light emitted by the light-emitting element in the red sub-pixel into red light, each of the green sub-pixels further includes a green color filter layer, the green color filter layer is used to convert the white light emitted by the light-emitting element in the green sub-pixel into green light, each of the blue sub-pixels further includes a blue color film layer, the blue color filter layer is used to convert the white light emitted by the light-emitting element in the blue sub-pixel into blue light; of course, it is understandable that in a case that the pixel unit includes the white sub-pixel, the color filter layer may be omitted in the white sub-pixel. It should be noted that, the embodiments of the present disclosure do not limit the types and specific structures of the light-emitting elements and the pixel circuits in all the sub-pixels.

Figure 3:
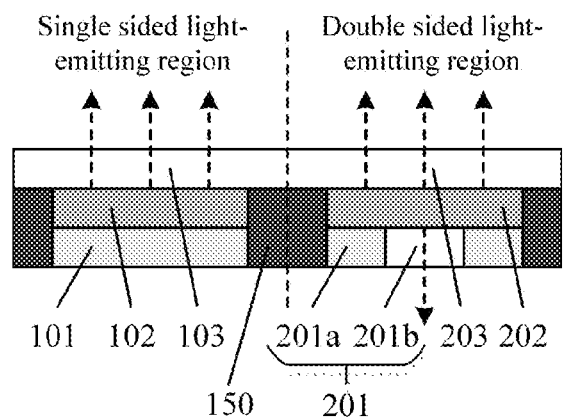
FIG. 3 is a cross-sectional structural schematic diagram of a light-emitting element in a display substrate provided by at least some embodiments of the present disclosure.

FIG. 3 is a cross-sectional structural schematic diagram of a light-emitting element in a display substrate provided by at least some embodiments of the present disclosure. For example, as illustrated by FIG. 3, the light-emitting element in the single-sided light-emitting region includes a first electrode 101, a first light-emitting functional layer 102, and a second electrode 103 that are stacked in sequence, the first electrode 101 is closer to a non-display side of the display substrate than the second electrode 103 (that is, a side facing a downward dashed arrow in FIG. 3); the light-emitting element in the double-sided light-emitting region includes a third electrode 201, a second light-emitting functional layer 202 and a fourth electrode 203 that are stacked in sequence, and the third electrode 201 is closer to the non-display side of the display substrate than the fourth electrode 203.

For example, the first electrode 101 is an opaque electrode. For example, a material of the first electrode 101 may include metal material, for example, a combination or at least one of gold, silver, copper, aluminum, molybdenum, gold alloys, silver alloys, copper alloys, aluminum alloys, molybdenum alloys, which is not limited by the embodiments of the present disclosure. For example, the second electrode 103 is a transparent electrode, so that the second electrode 103 allows the light emitted by the first light-emitting functional layer 102 to pass through and to be emitted to a display side of the display substrate (as showed by the upward dashed arrow in FIG. 3). For example, a material of the second electrode 103 may include a transparent conductive material, for example, may include a combination or at least one of indium tin oxide (ITO), zinc tin oxide (IZO), indium gallium tin oxide (IGZO), indium zinc tin oxide (IZTO), which is not limited by the embodiments of the present disclosure.

For example, at least a part the third electrode 201 is transparent. For example, in some examples, as illustrated by FIG. 3, the third electrode 201 includes a non-transparent portion 201a and a transparent portion 201b, the transparent portion 201b of the third electrode 201 allows light emitted by the second light-emitting functional layer 202 to pass through and to be emitted to the non-display side of the display substrate (as illustrated by the downward dashed arrow in FIG. 3). For example, in other examples, the third electrode 201 may only include a transparent portion 201b, that is, the third electrode 201 may be a transparent electrode. For example, the fourth electrode 203 is a transparent electrode, so that the fourth electrode 203 allows light emitted by the second light-emitting functional layer 202 to pass through and to be emitted to the display side of the display substrate (as illustrated by the upward dashed arrow in FIG. 3). For example, a material of the non-transparent portion 201a of the third electrode 201 may include a metal material, for example, a combination or at least one of gold, silver, copper, aluminum, molybdenum, gold alloy, silver alloy, copper alloy, aluminum alloy, and molybdenum alloy, which is not limited in the embodiments of the present disclosure. For example, a material of both the transparent portion 201b of the third electrode 201 and the fourth electrode 203 may include transparent conductive material, for example, may include a combination or at least one of indium tin oxide (ITO), zinc tin oxide (IZO), indium gallium tin oxide (IGZO), and indium zinc tin oxide (IZTO), which is not limited in the embodiments of the present disclosure.

For example, both the first light-emitting functional layer 102 and the second light-emitting functional layer 202 may include any one of a common organic light-emitting functional layer, an inorganic light-emitting functional layer (for example, a quantum well, such as a GaN/InGaN quantum well, or a GaAs/InGaAs quantum well), and a quantum dot light-emitting functional layer. For example, the organic light-emitting functional layer may include an organic light-emitting layer, and may also include an electron injection layer, an electron transport layer, a hole injection layer, and a hole transport layer, these layers can adopt common materials and structures, which will not be repeated herein. It should be noted that, the materials of the light-emitting functional layers (the first light-emitting functional layers 102 or the second light-emitting functional layers 202) of the light-emitting elements in the sub-pixels with different colors may be different.

For example, in some embodiments, for the light-emitting element in any sub-pixel in the single-sided light-emitting region and the light-emitting element in a sub-pixel that has a same light-emitting color as any one of the sub-pixels in the single-sided light-emitting region, the second electrode 103 is substantially the same as the fourth electrode 203 (that is, the shape, the material, the thickness, and the structure are substantially the same), the first light-emitting functional layer 102 is substantially the same as the second light-emitting functional layer 202 (that is, the shape, the material, the thickness and the structure are substantially the same); except for the transparent portion 201b, the third electrode 201 is substantially the same as the first electrode 101, that is, the shape and the thickness of the third electrode 201 are substantially the same as the shape and the thickness of the first electrode 101 respectively, at the same time, in a case that the third electrode 201 includes the non-transparent portion 201a, the material and the structure of the non-transparent portion 201a of the third electrode 201 are substantially the same as the material and the structure of the first electrode 101. That is, for the sub-pixels with a same light-emitting color in the single-sided light-emitting region and the double-sided light-emitting region, the only difference between the light-emitting elements of the sub-pixels is that the first electrode 101 is an opaque electrode, and a part of the third electrode 201 is transparent.

For example, in some embodiments, a value range of a ratio of an area of the transparent portion 201b of the third electrode 201 to an area (that is, a sum of areas of the non-transparent portion 201a and the transparent portion 201b) of the third electrode 201 is 5% to 20%, so that it can be ensured that the sub-pixels with a same light-emitting color in the single-sided light-emitting region and the double-sided light-emitting region have substantially the same lifetime curve, and further it is convenient for brightness compensation. For example, in some examples, the value range of the ratio of the area of the transparent portion 201b of the third electrode 201 to the area of the third electrode 201 may be 5% to 10%.

For example, in some embodiments, as illustrated by FIG. 2B to FIG. 2E, the at least one optical sensing unit corresponds to the at least one double-sided light-emitting region from the non-display side of the display substrate. The at least one optical sensing unit is configured to sense light emitted by the sub-pixels in the at least one double-sided light-emitting region during operation, and to provide sensing brightness information of the at least one double-sided light-emitting region to perform brightness compensation on the light-emitting region. For example, in some examples, an orthographic projection of the at least one double-sided light-emitting region on the at least one optical sensing unit (corresponding to the at least one double-sided light-emitting region) is overlapped with a photosensitive surface of the at least one optical sensing unit, so that the light emitted by the sub-pixels in the at least one double-sided light-emitting region during operation can be sensed by the at least one optical sensing unit. For example, in other examples, between the at least one double-sided light-emitting region and the at least one optical sensing unit (corresponding to the at least one double-sided light-emitting region), a light guide element (such as a reflect mirror, but not limited thereto) is further provided, the light guide element is used to guide the light emitted by the sub-pixels in the at least one double-sided light-emitting region during operation into the at least one optical sensing unit, so that the at least one optical sensing unit can sense. For example, the at least one optical sensing unit may use an optical lens or a light sensitive sensing element (for example, a visible light surface sensing element), the embodiments of the present disclosure include but are not limited thereto.

For example, in some embodiments, as illustrated by FIG. 2A to FIG. 2D, the display device may further include a sensing processor, and the sensing processor is configured to drive the at least one optical sensing unit to sense the light emitted by the sub-pixels during operation in the at least one double-sided light-emitting region, to obtain the sensing brightness information of the at least one double-sided light-emitting region.

For example, in some embodiments, as illustrated by FIG. 2A to FIG. 2D, the display device may further include a sense processor, and the sense processor is configured to drive the at least one optical sensing unit to sense the light emitted by the sub-pixels in the at least one double-sided light-emitting region during operation, to obtain the sensing brightness information of the at least one double-sided light-emitting region.

For example, in some embodiments, as illustrated by FIG. 2A to FIG. 2D, the display device may further include a gate driver and a data driver (also referred to as "source driver"). For example, the gate driver is connected with the pixel circuit in each sub-pixel on the display substrate by the gate line (not shown in the figure) on the display substrate, and the gate driver is configured to provide scanning signals to each sub-pixel on the display substrate; the data driver is connected with the pixel circuit in each sub-pixel on the display substrate by the data line (not shown in the figure) on the display substrate, and the data driver is configured to provide data signals to each sub-pixel on the display substrate. For example, the gate driver can be implemented by a bonded integrated circuit driver chip, of course, the gate driver can also be directly integrated on the display substrate in the form of a gate driving circuit to form a gate driver on array (GOA). For example, the data driver can be implemented by a bonded integrated circuit driver chip. It should be noted that, FIG. 2A to FIG. 2D exemplarily show that the gate driver is arranged on one side of the display substrate to perform single-side driving. In practical applications, gate drivers can also be arranged on opposite sides of the display side panel, respectively, to perform double-sided driving or cross-driving, which is not limited in the embodiments of the present disclosure.

For example, in some embodiments, as illustrated by FIG. 2A to FIG. 2D, the display device may further include a driving system, such as a time controller. For example, the time controller is configured to control driving of the above-described sensing processor and the gate driver, and to provide display data to the data driver.

For example, in some embodiments, as illustrated by FIG. 2A to FIG. 2D, in order to improve an integration of the display device, the sense processor and the data driver can be arranged on a bridge circuit board (as illustrated by the bridge circuit board 1 in FIG. 2A to FIG. 2D). The sense processor and the data driver are electrically connected with a driving system (for example, a time controller) by the bridge circuit board 1. For example, as illustrated by FIG. 2A to FIG. 2D, the bridge circuit board 1 may also be arranged with a gate passline, and the gate driver can be electrically connected with the driving system (for example, a time controller) by the gate passline on the bridge circuit board 1.

For example, in some embodiments, as illustrated by FIG. 2D to FIG. 2E, in order to improve the integration of the display device, the at least one optical sensing unit can be integrated on another bridge circuit board (as illustrated by the bridge circuit board 2 in FIG. 2D to FIG. 2E). The at least one optical sensing unit is electrically connected with the sense processor by the bridge circuit board 2.

Figure 4A:
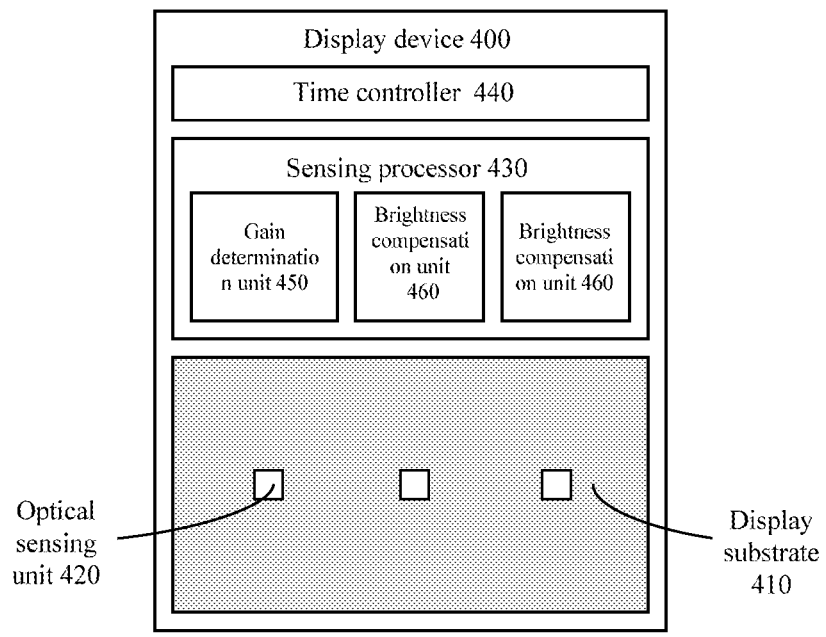
FIG. 4A is a structural schematic block diagram of a display device provided by at least some embodiments of the present disclosure.
Figure 4B:
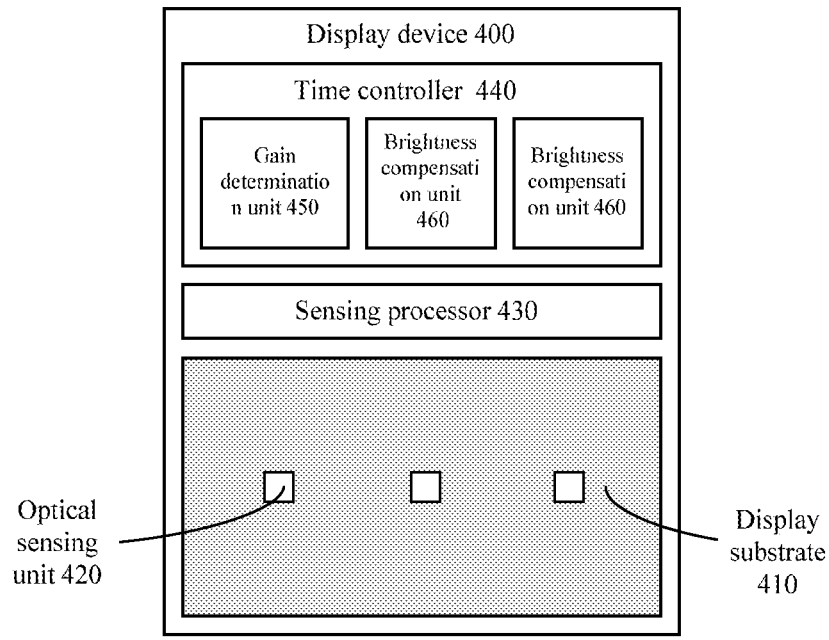
FIG. 4B is a structural schematic block diagram of another display device provided by at least some embodiments of the present disclosure.

FIG. 4A is a structural schematic block diagram of a display device provided by at least some embodiments of the present disclosure, and FIG. 4B is a structural schematic block diagram of another display device provided by at least some embodiments of the present disclosure. For example, as illustrated by FIG. 4A and FIG. B, in addition to the display substrate 410, the at least one optical sensing unit 420, the sense processor 430 and the time controller 440, the display device 400 may further include a standard brightness determination unit 450, a gain determination unit 460 and a brightness compensation unit 470. For example, the configuration of the display substrate 410, the at least one optical sensing unit 420, the sense processor 430 and the time controller 440 may refer to the relevant descriptions of the embodiments illustrated in FIG. 2A to FIG. 2E mentioned above, which will not be repeated herein.

For example, the standard brightness determination unit 450 is configured to determine standard brightness information of the at least one double-sided light-emitting region according to display data of sub-pixels in the at least one double-sided light-emitting region of the display substrate 410. For example, in some embodiments, the standard brightness determination unit 450 may search and determine the standard brightness information corresponding to the display data of the sub-pixels in the at least one double-sided light-emitting region of the display substrate 410 based on a corresponding relationship (for example, stored in a lookup table) between the display data and the standard brightness information that are pre-stored, so that the standard brightness information of the at least one double-sided light-emitting region is obtained. For example, the corresponding relationship between the display data and the standard brightness information can be determined by testing when the display device 400 leaves the factory, or can refer to test results of an initial use stage of the display device for testing with same specifications as the display device 400, and the embodiments of the present disclosure include but are not limited thereto.

For example, the gain determination unit 460 is configured to determine the brightness gain data according to the standard brightness information and the sensing brightness information (the sensing brightness information of the at least one double-sided light-emitting region is provided by the at least one optical sensing unit) of the at least one double-sided light-emitting region. For example, in some embodiments, the gain determination unit 460 may first calculate the brightness difference data according to the standard brightness information and the sensing brightness information of the at least one double-sided light-emitting region, and then determine the brightness gain data according to the brightness difference data. For example, the brightness difference data can be calculated according to the following formula (1):

$$\Delta L = L\_initial - L\_aging \quad (1)$$

in which, $\Delta L$ represents the brightness difference data of any one of the double-sided light-emitting regions, L_initial represents the standard brightness information of the any one of the double-sided light-emitting regions, and L_aging represents the standard brightness information of the any one of the double-sided light-emitting regions. For example, the gain determination unit 460 may search and determine the brightness gain data corresponding to the calculated brightness difference data based on the corresponding relationship (for example, stored in a lookup table) between the brightness difference data and the standard brightness information that are pre-stored. For example, the corresponding relationship between the brightness difference data and the standard brightness information can be referred to brightness compensation test results of the display device for testing with the same specification as the display device 400, and the embodiments of the present disclosure include but are not limited thereto.

For example, the brightness compensation unit 470 is configured to perform brightness compensation on the light-emitting region of the display substrate 410 according to the brightness gain data. For example, in some embodiments, the brightness compensation unit 470 can compensate the display data of the sub-pixels in the entire light-emitting region of the display substrate 410 according to the brightness gain data, and the compensated display data is supplied to the data driver, to implement brightness compensation for the entire light-emitting region of the display substrate 410. For example, in other embodiments, the brightness compensation unit 470 can compensate the power supply voltage (for example, at least one of a first power supply voltage ELVDD and a second power supply voltage ELVSS, in which, the first power supply voltage ELVDD and the second power supply voltage ELVSS are used to generate a driving current for driving the light-emitting element to emit light) applied to the sub-pixels in the entire light-emitting region of the display substrate 410 according to the brightness gain data, and the compensated power supply voltage is supplied to the sub-pixels in the entire light-emitting region, to realize brightness compensation for the entire light-emitting region of the display substrate 410. It should be noted that, the present disclosure includes but is not limited thereto, that is, in practical applications, any feasible methods can be adopted to perform brightness compensation according to the brightness gain data.

It should be noted that, in the display device 400 shown in FIG. 4A, the standard brightness determination unit 450, the gain determination unit 460, and the brightness compensation unit 470 may all be implemented by hardware, software, firmware, or any combination of them.

For example, in some embodiments, as illustrated by FIG. 4A, the standard brightness determination unit 450, the gain determination unit 460 and the brightness compensation unit 470 may all be arranged in the sense processor 430 (for example, integrated in the sense processor 430), that is, as a part of the sense processor 430; thus the sense processor 430 can not only implement the functions of the aforementioned sense processor, but also can implement the functions of the standard brightness determination unit 450, the gain determination unit 460 and the brightness compensation unit 470. For example, in other embodiments, as illustrated by FIG. 4B, the standard brightness determination unit 450, the gain determination unit 460, and the brightness compensation unit 470 may all be arranged in the time controller 440 (for example, integrated in the time controller 440), that is, as a part of the time controller 440; therefore, the time controller 440 can not only realize the functions of the aforementioned time controller, but also realize the functions of the standard brightness determination unit 450, the gain determination unit 460 and the brightness compensation unit 470. It should be noted that the present disclosure includes but is not limited thereto. For example, in still other embodiments, a part of the standard brightness determination unit 450, the gain determination unit 460 and the brightness compensation unit 470 may be integrated in the sensing processor 430, and the other part of the standard brightness determination unit 450, the gain determination unit 460 and the brightness compensation unit 470 may be integrated in the time controller 440. For example, in still other embodiments, the standard brightness determination unit 450, the gain determination unit 460, and the brightness compensation unit 470 may be integrated in the aforementioned data driver in a whole or in part. For example, in still other embodiments, one or more (including all) of the standard brightness determination unit 450, the gain determination unit 460 and the brightness compensation unit 470 may be separately arranged units, the standard brightness determination unit 450, the gain determination unit 460 and the brightness compensation unit 470 may be arranged between, for example, the sense processor 430 and the time controller 440, which is not limited in the present disclosure. It can be understood that, the embodiments of the present disclosure do not limit the arrangement and the implementations of the standard brightness determination unit 450, the gain determination unit 460 and the brightness compensation unit 470.

For example, in some embodiments, in the display device 400, the at least one double-sided light-emitting region on the display substrate 410 may include only one double-sided light-emitting region, correspondingly, the at least one optical sensing unit 420 may include only one optical sensing unit, and the double-sided light-emitting region corresponds to the optical sensing unit. In this case, the standard brightness determination unit 450 may determine the standard brightness information of the double-sided light-emitting region according to the display data of the sub-pixels in the double-sided light-emitting region; the gain determination unit 460 can determine the brightness gain data according to the standard brightness information and the sensing brightness information (the sensing brightness information of the double-sided light-emitting region is provided by the optical sensing unit) of the double-sided light-emitting region; the brightness compensation unit 470 may perform brightness compensation (this is, global brightness compensation) on the light-emitting region of the display substrate 410 according to the brightness gain data, that is, each sub-pixel in the light-emitting region of the display substrate 410 performs brightness compensation according to the brightness gain data.

For example, in other embodiments, as illustrated by FIG. 4A, in the display device 400, at least one double-sided light-emitting region on the display substrate 410 may include a plurality of double-sided light-emitting regions, the at least one optical sensing unit 420 may include a plurality of optical sensing units, and the plurality of double-sided light-emitting regions are in one-to-one correspondence with the plurality of optical sensing units. Hereinafter, various working principles of the aforementioned standard brightness determination unit 450, the gain determination unit 460 and the brightness compensation unit 470 will be further described in combination with the situation.

For example, in some embodiments, the standard brightness determination unit 450 may determine the standard brightness information of the plurality of double-sided light-emitting regions respectively according to the display data of the sub-pixels in the plurality of double-sided light-emitting regions. The gain determination unit 460 may determine a plurality of local brightness gain data (each of the double-sided light-emitting regions corresponds to a local brightness gain data) according to the standard brightness information and the sensing brightness information (the sensing brightness information of the plurality of double-sided light-emitting regions is respectively provided by the plurality of optical sensing units) of the plurality of double-sided light-emitting regions, and a maximum value or an average value of the plurality of local brightness gain data is used as brightness gain data; for example, the brightness difference data of each of the double-sided light-emitting regions can be calculated first according to the standard brightness information and the sensing brightness information of each double-sided light-emitting region (that is, the local brightness difference data, and a calculation method of the local brightness difference data can be referred to the aforementioned formula (1)), and then determine the local brightness gain data corresponding to each of the double-sided light-emitting regions according to the brightness difference data of each of the double-sided light-emitting regions. The brightness compensation unit 470 can perform global brightness compensation on the light-emitting region of the display substrate 410 according to the brightness gain data, that is, each sub-pixel in the light-emitting region of the display substrate 410 performs brightness compensation according to the brightness gain data. Of course, the brightness compensation unit 470 can also perform brightness compensation on the single-sided light-emitting region of the display substrate 410 according to the brightness gain data, at the same time, the brightness compensation unit 470 respectively performs brightness compensation on each of the double-sided light-emitting regions according to the local brightness gain data corresponding to each of the double-sided light-emitting regions.

For example, in other embodiments, the standard brightness determination unit 450 may determine the standard brightness information of the plurality of double-sided light-emitting regions respectively according to the display data of the sub-pixels in the plurality of double-sided light-emitting regions. The gain determination unit 460 may determine a plurality of local brightness difference data (each of the double-sided light-emitting regions corresponds to a local brightness difference data, and a calculation method of the local brightness difference data can be referred to the aforementioned formula (1)) according to the standard brightness information and the sensing brightness information (the sensing brightness information of the plurality of double-sided light-emitting regions is respectively provided by the plurality of optical sensing units) of the plurality of double-sided light-emitting regions. The maximum value or the average value of the plurality of local brightness difference data is used as brightness difference data, and determine the brightness gain data according to the brightness difference data. The brightness compensation unit 470 can perform global brightness compensation on the light-emitting region of the display substrate 410 according to the brightness gain data, that is, each sub-pixel in the light-emitting region of the display substrate 410 performs brightness compensation according to the brightness gain data. Of course, the brightness compensation unit 470 can also perform brightness compensation on the single-sided light-emitting region of the display substrate 410 according to the brightness gain data, at the same time, the brightness compensation unit 470 respectively performs brightness compensation on each of the double-sided light-emitting regions according to the local brightness gain data corresponding to each of the double-sided light-emitting regions.

Figure 5A:
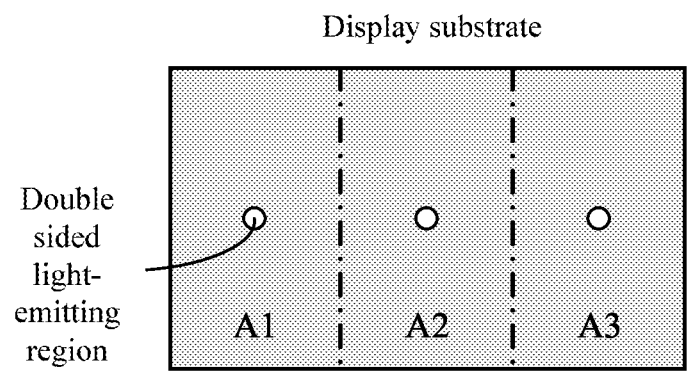
FIG. 5A is a schematic diagram of a light-emitting sub-region of a display substrate provided by at least some embodiments of the present disclosure.
Figure 5B:
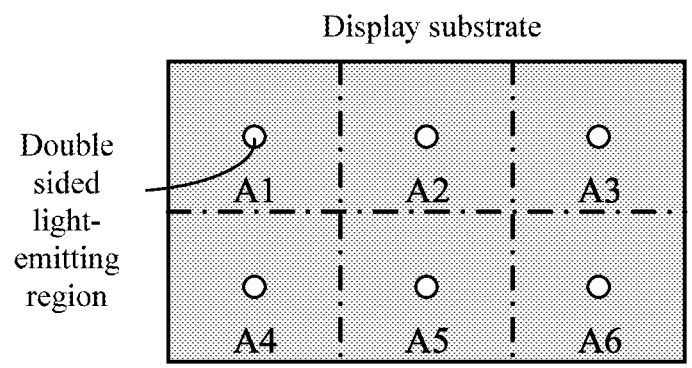
FIG. 5B is a schematic diagram of a light-emitting sub-region of another display substrate provided by at least some embodiments of the present disclosure.

For example, in further embodiments, the light-emitting region of the display substrate 410 may be divided into a plurality of light-emitting sub-regions in one to one correspondence to the plurality of double-sided light-emitting regions. FIG. 5A is a schematic diagram of a light-emitting sub-region of a display substrate provided by at least some embodiments of the present disclosure, and FIG. 5B is a schematic diagram of a light-emitting sub-region of another display substrate provided by at least some embodiments of the present disclosure. For example, as illustrated by FIG. 5A to FIG. 5B, a shape of the light-emitting region of the display substrate may be a rectangle, in this case, the light-emitting region of the display substrate can be divided into M*N light-emitting sub-regions (as illustrated by A1 to A3 in FIG. 5A and A1 to A6 in FIG. 5B, a dot-dash line in FIG. 5A to FIG. 5B can be regarded as a dividing line of different light-emitting sub-regions), in which both M and N are positive integers (FIG. 5A shows a case of M=1 and N=3, and FIG. 5B shows a case of M=2 and N=3), each of the light-emitting sub-regions may include, for example, a double-sided light-emitting region. It can be understood that, in order to achieve a better brightness compensation effect, the plurality of double-sided light-emitting regions can be uniformly distributed or approximately uniformly distributed in the light-emitting region; furthermore, each of the plurality of double-sided light-emitting regions can also be located near a center of a light-emitting sub-region where the double-sided light-emitting region is located. It should be noted that, the embodiments of the present disclosure include but are not limited thereto.

In this case, the standard brightness determination unit 450 may respectively determine the standard brightness information of the plurality of double-sided light-emitting regions according to the display data of the sub-pixels in the plurality of double-sided light-emitting regions. The gain determination unit 460 can respectively determine the local brightness gain data corresponding to the plurality of double-sided light-emitting regions according to the standard brightness information and the sensing brightness information (the sensing brightness information of the plurality of double-sided light-emitting regions is provided by the plurality of optical sensing units respectively) of the plurality of double-sided light-emitting regions, that is, the gain determination unit 460 respectively determines the local brightness gain data of the plurality of light-emitting sub-regions (the local brightness gain data corresponding to each double-sided light-emitting region is the local brightness gain data of the light-emitting sub-region corresponding to each double-sided light-emitting region); for example, the brightness difference data (that is, the local brightness difference data, the calculation method of the local brightness difference data can be referred to the aforementioned formula (1)) of each of the double-sided light-emitting regions can be calculated first according to the standard brightness information and the sensing brightness information of each of the double-sided light-emitting regions, then according to the brightness difference data of each double-sided light-emitting region, the local brightness gain data corresponding to each double-sided light-emitting region can be determined, that is, the local brightness gain data of the light-emitting sub-regions corresponding to each of the double-sided light-emitting regions is determined. The brightness compensation unit 470 may respectively perform brightness compensation (that is, partition brightness compensation) on the plurality of light-emitting sub-regions according to the local brightness gain data of the plurality of light-emitting sub-regions, that is, the sub-pixels in each of the plurality of light-emitting sub-regions of the display substrate 410 respectively perform brightness compensation according to the local brightness gain data of each of the plurality of light-emitting sub-regions. Therefore, it can carry out targeted brightness compensation on the sub-pixels at different positions of the display substrate, so that the brightness difference of the display screen is reduced, and the display quality is improved.

It should be noted that, in practical applications, the shape of the light-emitting region of the display substrate and the division method of the light-emitting sub-regions can be set according to actual requirements, which are not limited in the embodiments of the present disclosure. In addition, it should also be noted that, some or all of the light-emitting sub-regions may include, for example, a plurality of double-sided light-emitting regions, in this case, part or all of the light-emitting sub-regions can be regarded as a light-emitting region respectively, and the brightness compensation (for example, the brightness compensation may be performed according to the maximum value or the average value of local brightness gain data corresponding to the plurality of double-sided light-emitting regions in the part or all of the light-emitting sub-regions) is performed on some or all of the light-emitting sub-regions according to the brightness compensation method described in the above-mentioned embodiments, and the embodiments of the present disclosure include but are not limited thereto.

Figure 6A:
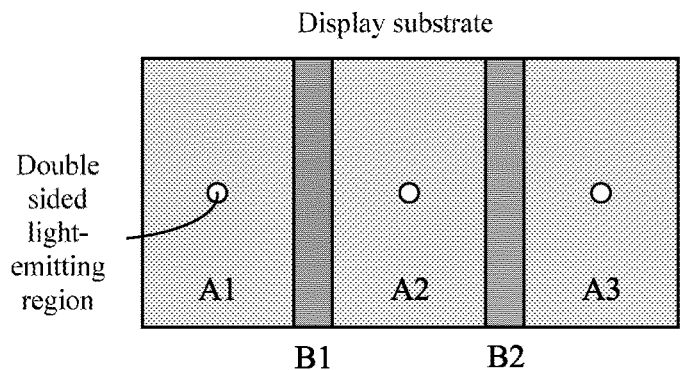
FIG. 6A is a schematic diagram of a light-emitting sub-region and a transition region of a display substrate provided by at least some embodiments of the present disclosure.
Figure 6B:
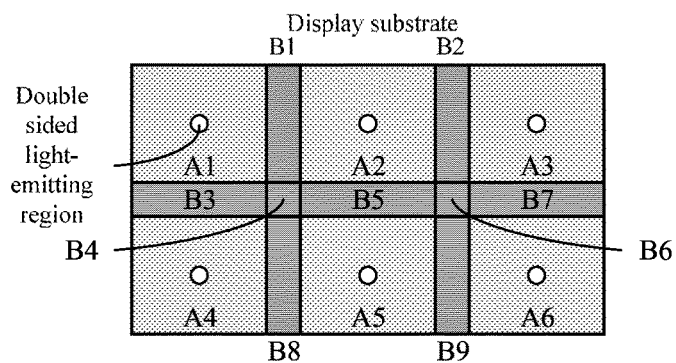
FIG. 6B is a schematic diagram of a light-emitting sub-region and a transition region of another display substrate provided by at least some embodiments of the present disclosure.

For example, in still other embodiments, the light-emitting region of the display substrate 410 may be divided into a plurality of light-emitting sub-regions corresponding to the plurality of double-sided light-emitting regions and a transition region between adjacent light-emitting sub-regions. FIG. 6A is a schematic diagram of a light-emitting sub-region and a transition region of a display substrate provided by at least some embodiments of the present disclosure, and FIG. 6B is a schematic diagram of a light-emitting sub-region and a transition region of another display substrate provided by at least some embodiments of the present disclosure. For example, as illustrated by FIG. 6A to FIG. 6B, the shape of the light-emitting region of the display substrate may be a rectangle, in this case, the light-emitting region of the display substrate can be divided into a plurality of light-emitting sub-regions and a transition region between adjacent light-emitting sub-regions, each of the light-emitting sub-regions may include, for example, a double-sided light-emitting region.

Specifically, for example, as illustrated by FIG. 6A, the light-emitting region of the display substrate may include 1*3 light-emitting sub-regions (as illustrated by A1 to A3 in FIG. 6A) and two transition regions B1 and B2, in which the transition region B1 is located between the light-emitting sub-region A1 and the light-emitting sub-region A2 which are adjacent to each other, and the transition region B2 is located between the light-emitting sub-region A2 and the light-emitting sub-region A3 which are adjacent to each other.

Specifically, for another example, as illustrated by FIG. 6B, the light-emitting region of the display substrate may include 2*3 light-emitting sub-regions (as illustrated by A1 to A6 in FIG. 6A) and a plurality of transition regions B1 to B9, in which the transition region B1 is located between the light-emitting sub-region A1 and the light-emitting sub-region A2 that are adjacent to each other, the transition region B2 is located between the light-emitting sub-region A2 and the light-emitting sub-region A3 that are adjacent to each other, and the transition region B3 is located between the light-emitting sub-region A1 and the light-emitting sub-region A4 that are adjacent to each other, the transition region B5 is located between the light-emitting sub-region A2 and the light-emitting sub-region A5 that are adjacent to each other, the transition region B7 is located between the light-emitting sub-region A3 and the light-emitting sub-region A6 that are adjacent to each other, the transition region B8 is located between the light-emitting sub-region A4 and the light-emitting sub-region A5 that are adjacent to each other, and the transition region B9 is located between the light-emitting sub-region A5 and the light-emitting sub-region A6 that are adjacent to each other. On the one hand, the transition region B4 can be regarded as being integral with any one of the transition regions B1, B3, B5 and B8, for example, in a case that the transition region B4 is considered as one with the transition region B1, it can be considered that the transition region B4 is also located between the light-emitting sub-region A1 and the light-emitting sub-region A2 that are adjacent to each other; on the other hand, the transition region B4 can also be regarded as being located among the light-emitting sub-region A1, the light-emitting sub-region A2, the light-emitting sub-region A4 and the light-emitting sub-region A5 that are adjacent. The case in the transition region B6 is similar to the case in the transition region B4, that is, on the one hand, the transition region B6 can be regarded as integral with any one of the transition regions B2, B5, B7, and B9, on the other hand, the transition region B6 can also be regarded as being located among the light-emitting sub-region A2, the light-emitting sub-region A3, the light-emitting sub-region A5, and the light-emitting sub-region A6 that are adjacent.

In this case, the standard brightness determination unit 450 may respectively determine the standard brightness information of the plurality of double-sided light-emitting regions according to the display data of the sub-pixels in the plurality of double-sided light-emitting regions. The gain determination unit 460 can respectively determine the local brightness gain data corresponding to the plurality of double-sided light-emitting regions according to the standard brightness information and the sensing brightness information (the sensing brightness information of the plurality of double-sided light-emitting regions is provided by the plurality of optical sensing units respectively) of the plurality of double-sided light-emitting regions, that is, the gain determination unit 460 respectively determines the local brightness gain data of the plurality of light-emitting sub-regions (the local brightness gain data corresponding to each double-sided light-emitting region is the local brightness gain data of the light-emitting sub-region corresponding to each double-sided light-emitting region); for example, the brightness difference data (that is, the local brightness difference data, and the calculation method of the local brightness difference data can be referred to the aforementioned formula (1)) of each of the double-sided light-emitting regions can be calculated first according to the standard brightness information and the sensing brightness information of each of the double-sided light-emitting regions, then according to the brightness difference data of each double-sided light-emitting region, the local brightness gain data corresponding to each double-sided light-emitting region can be determined, that is, the local brightness gain data of the light-emitting sub-regions corresponding to each of the double-sided light-emitting regions is determined. Furthermore, the gain determination unit 460 can also determine the local brightness gain data of the transition region between the adjacent light-emitting sub-regions according to the local brightness-gain data of the adjacent light-emitting sub-regions; for example, the local brightness gain data of the transition region located between the adjacent light-emitting sub-regions may be calculated by an interpolation method (for example, including but not limited to a linear interpolation method, or a bilinear interpolation method) according to the local brightness gain data of the adjacent light-emitting sub-regions. Correspondingly, the brightness compensation unit 470 can not only perform brightness compensation on the plurality of light-emitting sub-regions according to the local brightness gain data of the plurality of light-emitting sub-regions, but also preform brightness compensation on each transition region according to the local brightness gain data of each transition region. It can be understood that, in a case that the light-emitting region of the display substrate only includes different light-emitting sub-regions (as illustrated by FIG. 5A to FIG. 5B), there may be a problem that the display screen is visually partitioned due to a large difference in the local brightness gain data of the adjacent light-emitting sub-regions, the arrangement of the transition region and its brightness compensation method can avoid the above problem, so that the brightness difference of the display screen is further reduced, and the display quality is improved.

Specifically, for example, in the embodiment shown in FIG. 6A, the local brightness gain data of the transition region B1 can be calculated by using the linear interpolation method according to the local brightness gain data of the light-emitting sub-region A1 and the light-emitting sub-region A2; and the local brightness gain data of the transition region B2 may be calculated by using the linear interpolation method according to the local brightness gain data of the light-emitting sub-region A2 and the light-emitting sub-region A3.

Specifically, for another example, in the embodiment shown in FIG. 6B, the local brightness gain data of the transition region B1 can be calculated by using the linear interpolation method according to the local brightness gain data of the light-emitting region A1 and the light-emitting region A2, the local brightness gain data of the transition region B2 can be calculated by using the linear interpolation method according to the local brightness gain data of the light-emitting sub-region A2 and the light-emitting sub-region A3, the local brightness gain data of the transition region B3 can be calculated by using the linear interpolation method according to the local brightness gain data of the light-emitting sub-region A1 and the light-emitting sub-region A4, the local brightness gain data of the transition region B5 can be calculated by using the linear interpolation method according to the local brightness gain data of the light-emitting sub-region A2 and the light-emitting sub-region A5, the local brightness gain data of the transition region B7 can be calculated by using the linear interpolation method according to the local brightness gain data of the light-emitting sub-region A3 and the light-emitting sub-region A6, the local brightness gain data of the transition region B8 can be calculated by using the linear interpolation method according to the local brightness gain data of the light-emitting sub-region A4 and the light-emitting sub-region A5, the local brightness gain data of the transition region B9 can be calculated by the linear interpolation method according to the local brightness gain data of the light-emitting sub-region A5 and the light-emitting sub-region A6; on one hand, the local brightness gain data of the transition region B4 may be consistent with the local brightness gain data of any one of the transition regions B1, B3, B5, and B8 (that is, the transition region B4 is regarded as one with any one of the transition regions B1, B3, B5, and B8), on the other hand, the local brightness gain data of the transition region B4 can be calculated by the bilinear interpolation method according to the local brightness gain data of the light-emitting sub-region A1, the light-emitting sub-region A2, the light-emitting sub-region A4 and the light-emitting sub-region A5 (that is, the transition region B4 is regarded as being located among the light-emitting sub-regions A1, light-emitting sub-region A2, light-emitting sub-region A4 and light-emitting sub-region A5 that are adjacent); similarly, on one hand, the local brightness gain data of the transition region B6 may be consistent with the local brightness gain data of any one of the transition regions B2, B5, B7, and B9 (that is, the transition region B6 is regarded as one with any one of the transition regions B2, B5, B7, and B9), on the other hand, the local brightness gain data of the transition region B6 can be calculated by the bilinear interpolation method according to the local brightness gain data of the light-emitting sub-region A2, the light-emitting sub-region A3, the light-emitting sub-region A5 and the light-emitting sub-region A6 (that is, the transition region B6 is regarded as being located between the adjacent light-emitting sub-regions A2, A3, A5 and A6).

For example, in still other embodiments, for the display device 400 shown in FIG. 4A, individual brightness compensation of each of the sub-pixels in the light-emitting region of the display substrate 410 may be performed in combination with a data accumulation algorithm. For example, the display device 400 may include a data accumulation calculation unit (not shown in FIG. 4A), the data accumulation calculation unit is used to record accumulated display information of each of the sub-pixels in the light-emitting region; for example, the accumulated display information may be an accumulation of actual used display data and its duration, the display data actually used includes the display data before compensation and/or the display data after compensation used in the previous stage, and the embodiments of the present disclosure include but are not limited thereto. For example, the accumulated display information can be characterized using accumulated display time; for example, the accumulated display time can be expressed as $T=\Sigma_i C_i x_i t_i$, in which T represents the accumulated display time, $x_i$ represents the display data, $t_i$ represents the duration of display data $x_i$, $C_i$ represents the weight of the display data $x_i$; the weight $C_i$ can be determined by testing a display device for testing with the same specification as the display device 400, alternatively, the weight $C_i$ can also be set according to actual requirements. It should be noted that the embodiments of the present disclosure include but are not limited thereto.

In this situation, the standard brightness determination unit 450 may determine the standard brightness information of the at least one double-sided light-emitting region according to the display data of the sub-pixels in the at least one double-sided light-emitting region. The gain determining unit 460 may: determine the degradation degree estimation data of each of the sub-pixels in the light-emitting region according to the accumulated display information of each of the sub-pixels in the light-emitting region; determine the degradation degree calculation data of the sub-pixels in the at least one double-sided light-emitting region according to the standard brightness information and the sensing brightness information (the sensing brightness information of the at least one double-sided light-emitting region is respectively provided by the at least one optical sensing unit) of the at least one double-sided light-emitting region; determine the degradation degree correction data according to the degradation degree estimation data and the degradation degree calculation data of the sub-pixels in the at least one double-sided light-emitting region; determine the degradation-degree calculation data of each of the sub-pixels in the single-side light-emitting region according to the degradation degree estimation data of each of the sub-pixels in the single-side light-emitting region and the degradation-degree correction data; and determine the individual brightness gain data of each of the sub-pixels in the light-emitting region according to the calculation data of the degradation degree of each of the sub-pixels in the light-emitting region. Correspondingly, the brightness compensation unit 470 may perform brightness compensation (that is, individual brightness compensation) on each of the sub-pixels in the light-emitting region according to the individual brightness gain data of each of the sub-pixels in the light-emitting region. Therefore, targeted individual brightness compensation can be performed on each of the sub-pixels of the display substrate, so that the problem of abnormal display caused by the degradation of sub-pixels is alleviated, and the display quality is improved.

Figure 7:
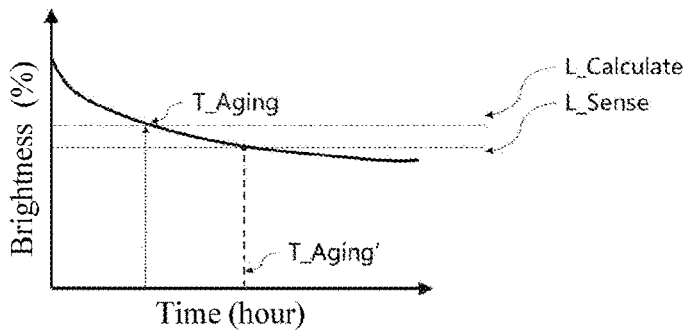
FIG. 7 is a schematic diagram of a sub-pixel degradation model provided by at least some embodiments of the present disclosure.

FIG. 7 is a schematic diagram of a sub-pixel degradation model provided by at least some embodiments of the present disclosure. The sub-pixel degradation model in FIG. 7 shows a corresponding relationship between the display brightness of the sub-pixel and its accumulated display information (for example, the aforementioned accumulated display time); for example, the corresponding relationship can be obtained by testing a display device for testing with the same specifications as the display device 400, and the corresponding relationship can be, for example, stored in a lookup table. For example, as illustrated by FIG. 7, for any one of the sub-pixels, its accumulated display information can be characterized by the accumulated display time T_Aging (for example, recorded and converted by the accumulated calculation unit), so that the degradation degree estimation data can be determined according to a corresponding relationship curve shown in FIG. 7, for example, the degradation degree estimation data can be characterized by using T_Aging or the estimated display brightness L_Calculate corresponding to T_Aging. In addition, the degradation degree calculation data of the sub-pixels in the at least one double-sided light-emitting region may also be determined according to the standard brightness information (for example, the display brightness in a case that the display time is 0 in FIG. 7) and the sensing brightness information (for example, the sensing display brightness L_Sense in FIG. 7) of the at least one double-sided light-emitting region, for example, the degradation degree calculation data can be characterized by L_Sense or an equivalent accumulated display time T_Aging' corresponding to L_Sense; it can be understood that the representations of the degradation degree estimation data and the degradation degree calculation data are generally consistent. On this basis, the degradation degree correction data may be determined according to the degradation degree estimation data and the degradation degree calculation data of the sub-pixels in the at least one double-sided light-emitting region; for example, proportional correction can be performed based on the degradation degree estimation data (for example, the accumulated display time T_Aging) and the degradation degree calculation data (for example, the equivalent accumulated display time T_Aging'). Therefore, the degradation degree calculation data of each of the sub-pixels in the single-sided light-emitting region can be determined according to the degradation-degree estimation data of each of the sub-pixels in the single-sided light-emitting region and the degradation degree correction data. Furthermore, the individual brightness gain data of each of the sub-pixels in the light-emitting region can be determined according to the degradation degree calculation data of each of the sub-pixels in the light-emitting region.

It should be noted that, in the embodiments of the present disclosure, according to the color type arrangement of the sub-pixels in the display substrate 410, test images of different colors can be lighted on the display substrate 410, to determine the brightness gain data of each of the color sub-pixels accordingly. For example, taking the display substrate 410 including red sub-pixels, green sub-pixels and blue sub-pixels as an example, the red test image, the green test image and the blue test image can be respectively lighted on the display substrate 410, so that the brightness gain data of each of the color sub-pixels can be determined by the cooperation of the optical sensing unit 420, the standard brightness determination unit 450, the gain determination unit 460 and the brightness compensation unit 470, and the brightness compensation is performed on each of the color sub-pixels on the display substrate 410 according to the brightness gain data of each of the color sub-pixels. It should also be noted that, in the embodiments of the present disclosure, the brightness compensation test can be performed on the display device for testing with the same specification as the display device 400, and various required corresponding relationships can be determined by modeling (for example, the corresponding relationship between the display data and the standard brightness information, the corresponding relationship between the brightness difference data and the standard brightness information, and the corresponding relationship between the display brightness and the accumulated display information in the above-mentioned embodiments), to be used for the brightness compensation process of the display device 400.

For example, the display device provided by the embodiments of the present disclosure may be any product or component with a display function, such as a monitor, a TV, an electronic paper display device, a mobile phone, a tablet computer, a notebook computer, a digital photo frame, and a navigator. It should be noted that, the display device may further include other conventional components or structures, for example, in order to realize necessary functions of the display device, those skilled in the art can set other conventional components or structures (for example, signal decoding circuits, or voltage conversion circuits) according to specific application scenarios, which are not limited in the embodiments of the present disclosure.

The embodiments of the present disclosure provide a double-sided light-emitting design of the display substrate and an optical sensing unit arranged on the non-display side of the display substrate, under a condition of not affecting the display screen, the sensing brightness information of the double-sided light-emitting region can be obtained to perform brightness compensation on the light-emitting region of the display substrate, so that abnormal display problems such as uneven brightness caused by sub-pixel degradation can be improved, thereby improving the display quality.

Some embodiments of the present disclosure further provide a driving method of a display device. For example, the display device is the display device provided in any one of the above-mentioned embodiments. For example, as illustrated by FIG. 2A to FIG. 2E, the display device includes a display substrate and at least one optical sensing unit; the display substrate includes a light-emitting region and a plurality of pixel units located in the light-emitting region, each pixel unit in the plurality of pixel units includes a plurality of sub-pixels; the at least one optical sensing unit corresponds to the at least one double-sided light-emitting region from the non-display side of the display substrate, the at least one optical sensing unit is configured to sense light emitted by the sub-pixels during operation in the at least one double-sided light-emitting region, and provides the sensing brightness information of the at least one double-sided light-emitting region to perform brightness compensation on the light-emitting region.

Figure 8:
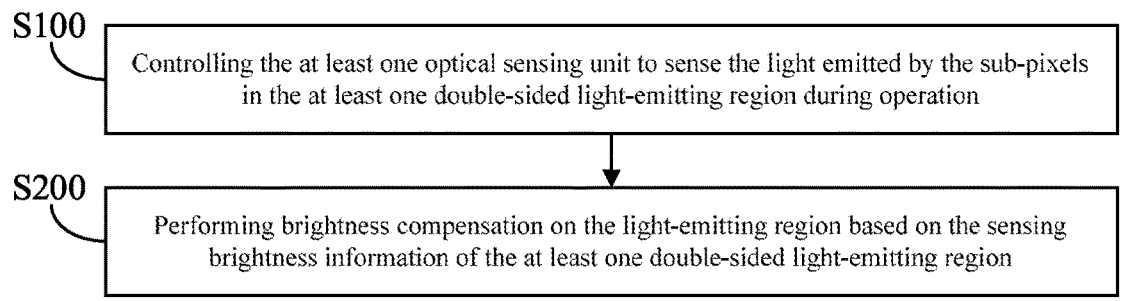
FIG. 8 is a flowchart of a driving method provided by at least some embodiments of the present disclosure.
Figure 9:
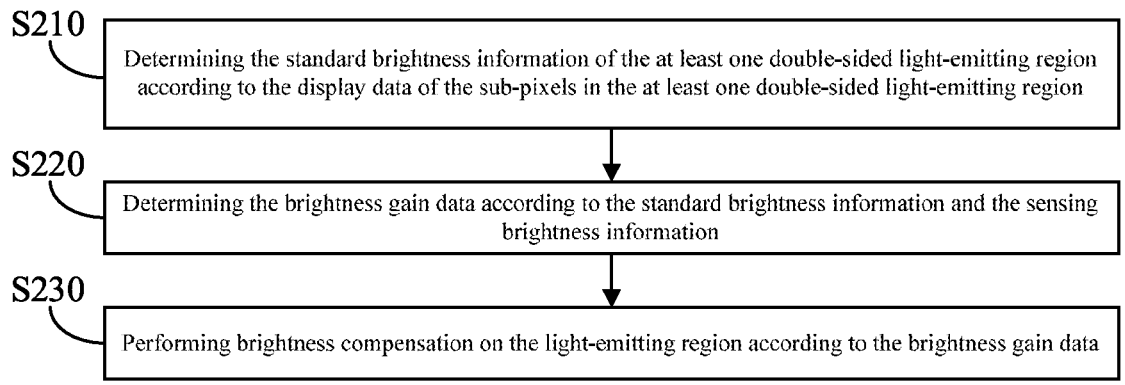
FIG. 9 is an exemplary flowchart corresponding to step S200 shown in FIG. 8 provided by at least some embodiments of the present disclosure.

FIG. 8 is a flowchart of a driving method provided by at least some embodiments of the present disclosure, and FIG. 9 is an exemplary flowchart corresponding to step S200 shown in FIG. 8 provided by at least some embodiments of the present disclosure.

For example, as illustrated by FIG. 8, the driving method includes the following step S100 and step S200:

Step S100: controlling the at least one optical sensing unit to sense the light emitted by the sub-pixels in the at least one double-sided light-emitting region during operation.

For example, in some examples, test images of different colors may be lighted on the display substrate, and the at least one optical sensing unit may be controlled to sense light emitted by the sub-pixels of different colors in the at least one double-sided light-emitting region, to obtain the sensing brightness information of the sub-pixels of different colors in the at least one double-sided light-emitting region.

Step S200: performing brightness compensation on the light-emitting region based on the sensing brightness information of the at least one double-sided light-emitting region.

For example, in some examples, the sensing brightness information of the at least one double-sided light-emitting region includes the sensing brightness information of the sub-pixels of different colors in the at least one double-sided light-emitting region; in this situation, based on the sensing brightness information of the sub-pixels of different colors in the at least one double-sided light-emitting region, brightness compensation can be respectively performed on the sub-pixels of different colors in the light-emitting region.

For example, in some embodiments, as illustrated by FIG. 4A, the display device may further include a standard brightness determination unit, a gain determination unit, and a brightness compensation unit. The standard brightness determination unit is configured to determine the standard brightness information of the at least one double-sided light-emitting region of the display substrate according to the display data of the sub-pixels in the at least one double-sided light-emitting region; the gain determination unit is configured to determine the brightness gain data according to the standard brightness information and the sensing brightness information of the at least one double-sided light-emitting region; the brightness compensation unit is configured to perform brightness compensation on the light-emitting region of the display substrate according to the brightness gain data. In this case, as illustrated by FIG. 9, step S200 in the above-mentioned driving method may include the following step S210 to step S230.

Step S210: determining the standard brightness information of the at least one double-sided light-emitting region according to the display data of the sub-pixels in the at least one double-sided light-emitting region.

For example, in some examples, the standard brightness information corresponding to the display data of the sub-pixels in the at least one double-sided light-emitting region of the display substrate may be determined based on the corresponding relationship (for example, stored in a lookup table) between the pre-stored display data and the standard brightness information, so that the standard brightness information of the at least one double-sided light-emitting region is obtained. For example, the corresponding relationship between the display data and the standard brightness information can be determined by testing in a case that the display device leaves the factory, or it can refer to test results in the initial use stage of the display device for testing with the same specification as the display device, and the embodiments of the present disclosure include but are not limited thereto.

Step S220: determining the brightness gain data according to the standard brightness information and the sensing brightness information.

For example, in some examples, the brightness difference data may be calculated first according to the standard brightness information and the sensing brightness information of the at least one double-sided light-emitting region (for details, please refer to the aforementioned formula (1)), and then the brightness gain data is determined according to the brightness difference data. For example, the brightness gain data corresponding to the calculated brightness difference data may be searched and determined based on the corresponding relationship (for example, stored in a lookup table) between the pre-stored brightness difference data and the standard brightness information.

Step S230: performing brightness compensation on the light-emitting region according to the brightness gain data.

For example, in some examples, the display data of the sub-pixels in the entire light-emitting region of the display substrate may be compensated according to the brightness gain data, the compensated display data is supplied to the data driver, to realize brightness compensation for the entire light-emitting region of the display substrate. For example, in other examples, the power supply voltage (for example, at least one of the first power supply voltage ELVDD and the second power supply voltage ELVSS, in which the first power supply voltage ELVDD and the second power supply voltage ELVSS are used to generate a driving current for driving the light-emitting element to emit light) applied to the sub-pixels in the entire light-emitting region of the display substrate may be compensated according to the brightness gain data, the compensated power supply voltage is supplied to the sub-pixels in the entire light-emitting region, to realize brightness compensation for the entire light-emitting region of the display substrate. It should be noted that the embodiments of the present disclosure include but are not limited thereto, that is, in practical applications, any feasible methods can be adopted to perform brightness compensation according to the brightness gain data.

Figure 10:
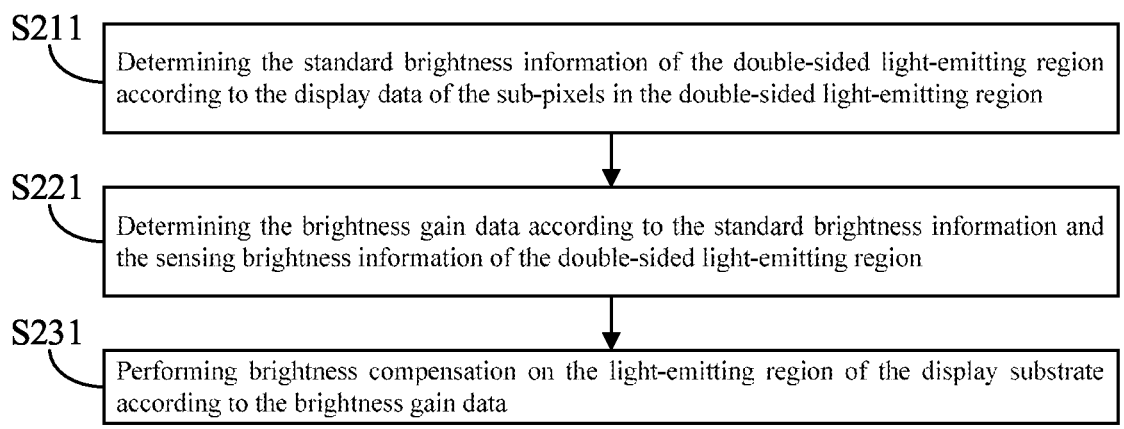
FIG. 10 is an exemplary flowchart corresponding to step S210 to step S230 shown in FIG. 9 provided by at least some embodiments of the present disclosure.

FIG. 10 is an exemplary flowchart corresponding to step S210 to step S230 shown in FIG. 9 provided by at least some embodiments of the present disclosure. For example, in some embodiments, in a display device, the at least one double-sided light-emitting region on the display substrate may include only one double-sided light-emitting region, accordingly, the at least one optical sensing unit may include only one optical sensing unit, and the double-sided light-emitting region corresponds to the optical sensing unit. In this case, as illustrated by FIG. 10, step S210 may include step S211: determining the standard brightness information of the double-sided light-emitting region according to the display data of the sub-pixels in the double-sided light-emitting region; step S220 may include step S221: determining the brightness gain data according to the standard brightness information and the sensing brightness information of the double-sided light-emitting region; step S230 may include step S231: performing brightness compensation (that is, global brightness compensation) on the light-emitting region of the display substrate according to the brightness gain data. That is, each sub-pixel in the light-emitting region of the display substrate performs brightness compensation according to the brightness gain data.

Figure 11:
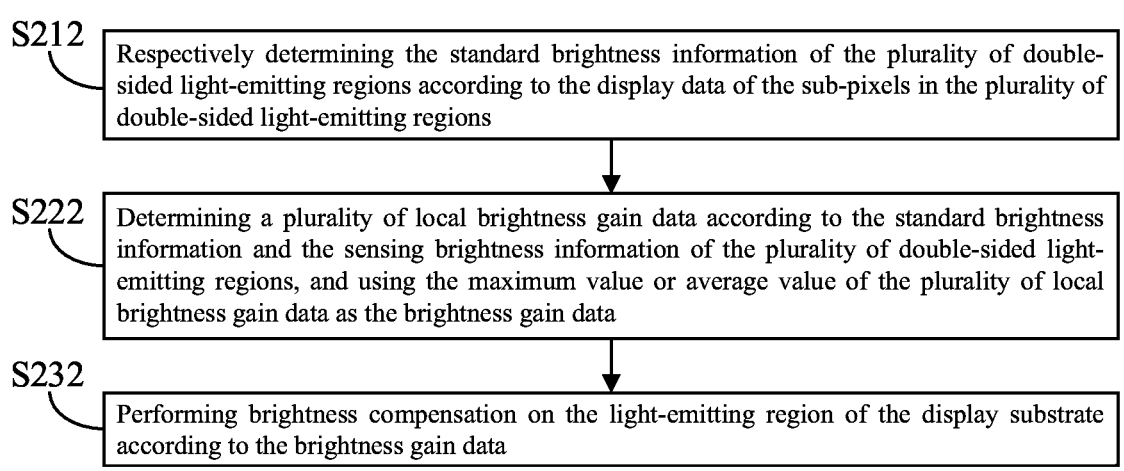
FIG. 11 is another exemplary flowchart corresponding to step S210 to step S230 shown in FIG. 9 provided by at least some embodiments of the present disclosure.
Figure 12:
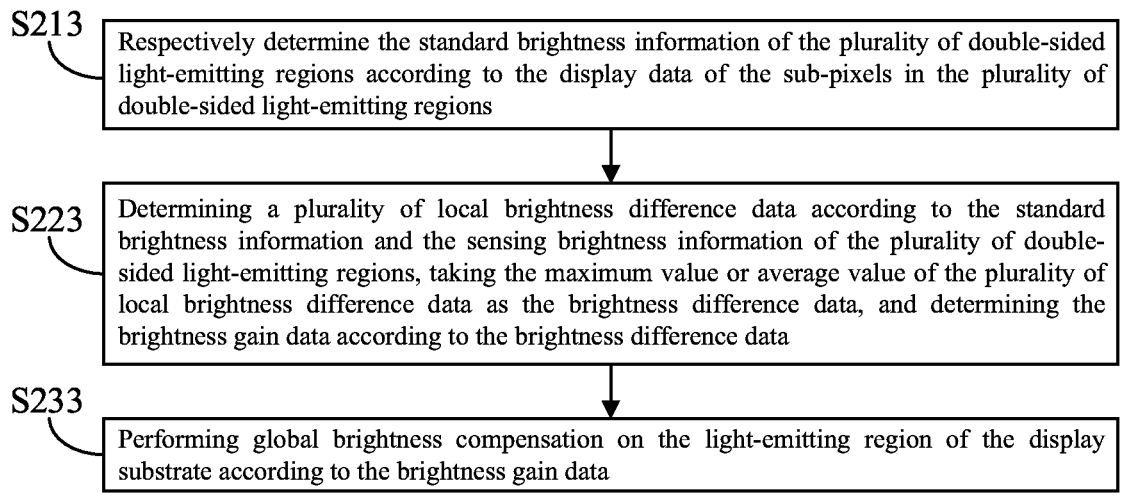
FIG. 12 is still another exemplary flowchart corresponding to step S210 to step S230 shown in FIG. 9 provided by at least some embodiments of the present disclosure.
Figure 13:
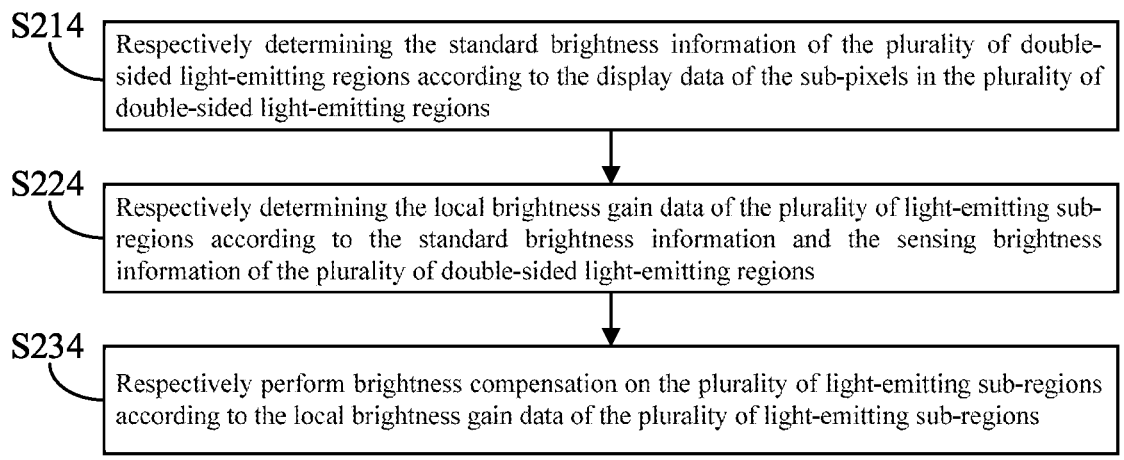
FIG. 13 is still another exemplary flowchart corresponding to step S210 to step S230 shown in FIG. 9 provided by at least some embodiments of the present disclosure.
Figure 14:
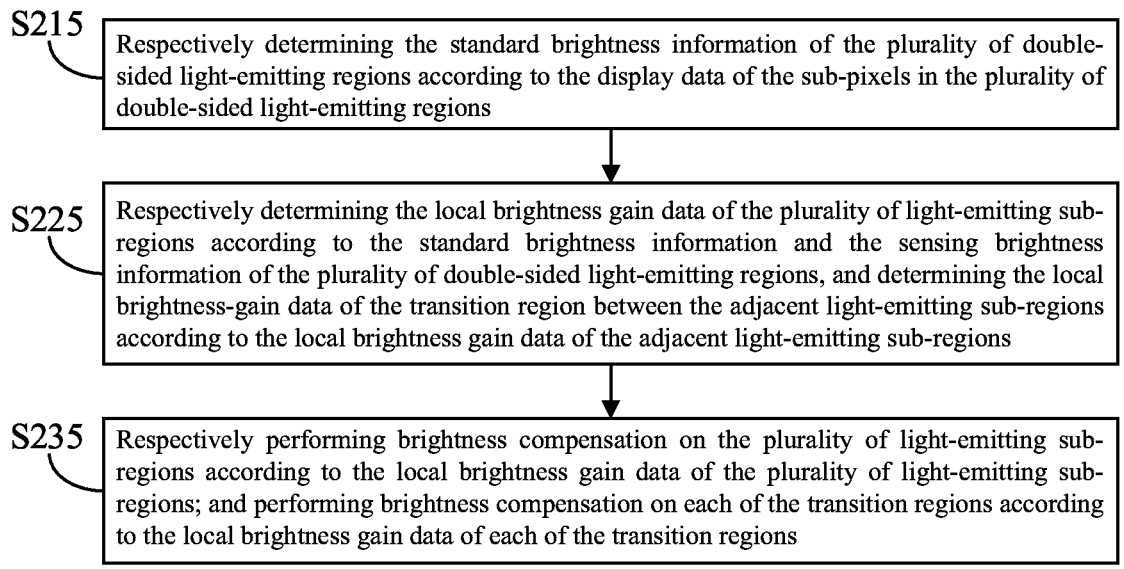
FIG. 14 is still another exemplary flowchart corresponding to step S210 to step S230 shown in FIG. 9 provided by at least some embodiments of the present disclosure.
Figure 15:
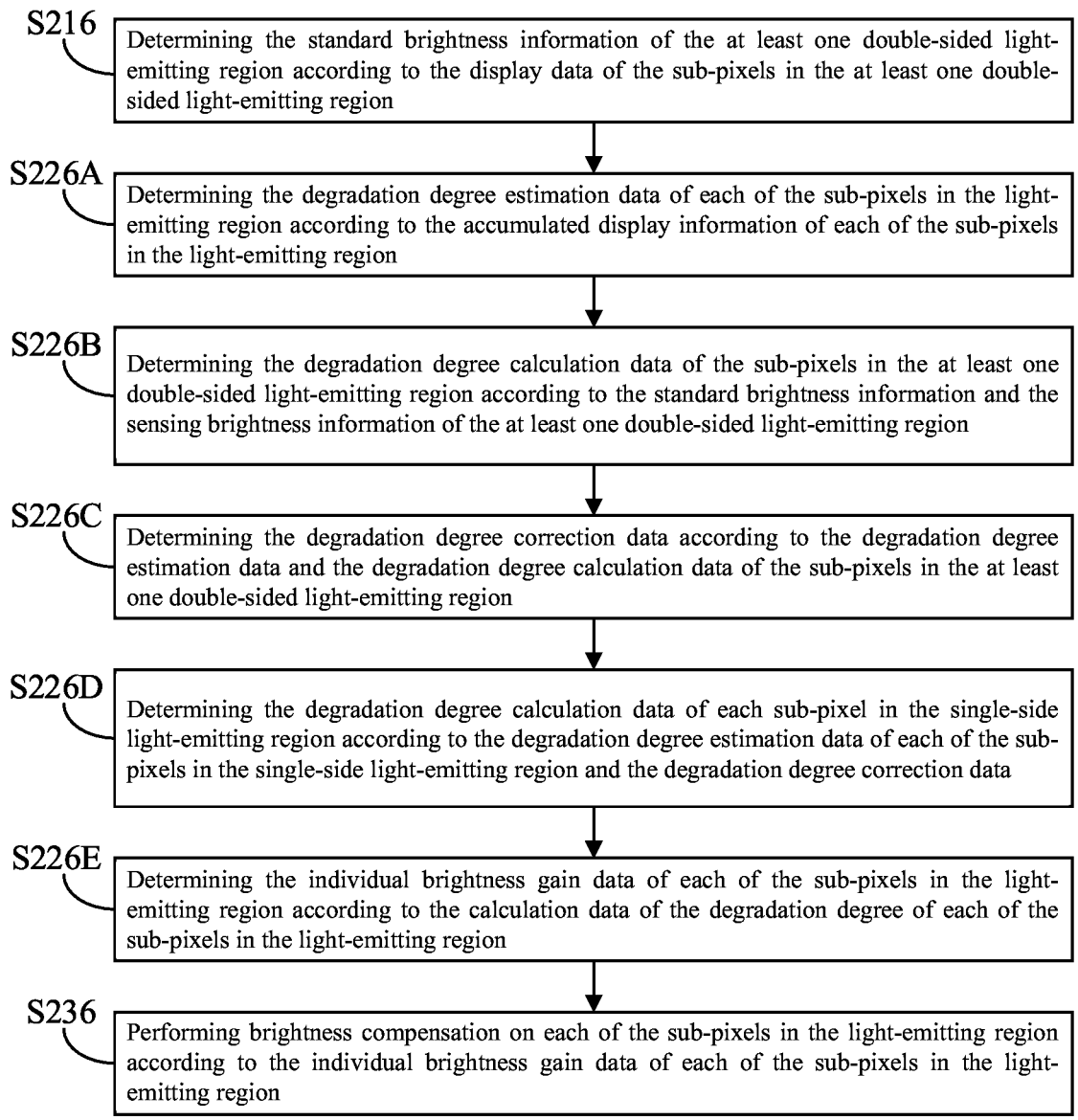
FIG. 15 is still another exemplary flowchart corresponding to step S210 to step S230 shown in FIG. 9 provided by at least some embodiments of the present disclosure.

For example, in other embodiments, as illustrated by FIG. 4A, in the display device, the at least one double-sided light-emitting region on the display substrate may include a plurality of double-sided light-emitting regions, and the at least one optical sensing unit may include a plurality of optical sensing units, and the plurality of double-sided light-emitting regions correspond to the plurality of optical sensing units one by one. FIG. 11 is another exemplary flowchart corresponding to step S210 to step S230 shown in FIG. 9 provided by at least some embodiments of the present disclosure, FIG. 12 is still another exemplary flowchart corresponding to step S210 to step S230 shown in FIG. 9 provided by at least some embodiments of the present disclosure, FIG. 13 is still another exemplary flowchart corresponding to step S210 to step S230 shown in FIG. 9 provided by at least some embodiments of the present disclosure, FIG. 14 is still another exemplary flowchart corresponding to step S210 to step S230 shown in FIG. 9 provided by at least some embodiments of the present disclosure, and FIG. 15 is still another exemplary flowchart corresponding to step S210 to step S230 shown in FIG. 9 provided by at least some embodiments of the present disclosure. Specific details of the driving method in this case (for example, step S210 to step S230) will be further described below with reference to FIG. 11 to FIG. 15. It can be understood that, in order to achieve a better brightness compensation effect, the plurality of double-sided light-emitting regions can be uniformly distributed or approximately uniformly distributed in the light-emitting region; furthermore, each of the double-sided light-emitting regions can also be located near a center of the light-emitting sub-region where the double-sided light-emitting region is located. It should be noted that the embodiments of the present disclosure include but are not limited thereto.

For example, in some examples, as illustrated by FIG. 11, step S210 may include step S212: respectively determining the standard brightness information of the plurality of double-sided light-emitting regions according to the display data of the sub-pixels in the plurality of double-sided light-emitting regions; step S220 may include step S222: determining a plurality of local brightness gain data (each of the double-sided light-emitting regions corresponds to a local brightness gain data) according to the standard brightness information and the sensing brightness information (the sensing brightness information of the plurality of double-sided light-emitting regions is provided by the plurality of optical sensing units respectively) of the plurality of double-sided light-emitting regions, and using the maximum value or the average value of the plurality of local brightness gain data as the brightness gain data; step S230 may include step S232: performing brightness compensation (global brightness compensation) on the light-emitting region of the display substrate according to the brightness gain data. Of course, in practical applications, brightness compensation can also be performed on the single-sided light-emitting region of the display substrate according to the brightness gain data, at the same time, the brightness compensation of each of the double-sided light-emitting regions is respectively performed according to the local brightness gain data corresponding to each of the double-sided light-emitting regions.

For example, in other examples, as illustrated by FIG. 12, step S210 may include step S213: respectively determine the standard brightness information of the plurality of double-sided light-emitting regions according to the display data of the sub-pixels in the plurality of double-sided light-emitting regions; Step S220 may include step S223: determining a plurality of local brightness difference data (each of the double-sided light-emitting region corresponds to a local brightness difference data, and a calculation method of the local brightness difference data can be referred to the above-mentioned formula (1)) according to the standard brightness information and the sensing brightness information (the sensing brightness information of the plurality of double-sided light-emitting regions is provided by the plurality of optical sensing units respectively) of the plurality of double-sided light-emitting regions, taking the maximum value or average value of the plurality of local brightness difference data as the brightness difference data, and determining the brightness gain data according to the brightness difference data; Step S230 may include step S233: performing global brightness compensation on the light-emitting region of the display substrate according to the brightness gain data. Of course, in practical applications, brightness compensation can also be performed on the single-sided light-emitting region of the display substrate according to the brightness gain data, at the same time, the brightness compensation of each of the double-sided light-emitting regions is respectively performed according to the local brightness gain data corresponding to each of the double-sided light-emitting regions.

For example, in some further examples, as illustrated by FIG. 5A to FIG. 5B, the light-emitting region of the display substrate may be divided into a plurality of light-emitting sub-regions corresponding to the plurality of double-sided light-emitting regions one by one. In this case, as illustrated by FIG. 13, step S210 may include step S214: respectively determining the standard brightness information of the plurality of double-sided light-emitting regions according to the display data of the sub-pixels in the plurality of double-sided light-emitting regions; step S220 may include step S224: respectively determining the local brightness gain data (that is, the local brightness gain data corresponding to the plurality of double-sided light-emitting regions are determined respectively, and the local brightness gain data corresponding to each of the double-sided light-emitting regions is the local brightness gain data of the light-emitting sub-region corresponding to each of the double-sided light-emitting regions) of the plurality of light-emitting sub-regions according to the standard brightness information and the sensing brightness information (the sensing brightness information of the plurality of double-sided light-emitting regions is provided by the plurality of optical sensing units respectively) of the plurality of double-sided light-emitting regions; Step S230 may include step S234: respectively perform brightness compensation (that is, partition brightness compensation) on the plurality of light-emitting sub-regions according to the local brightness gain data of the plurality of light-emitting sub-regions. Therefore, targeted brightness compensation can be performed on the sub-pixels at different positions of the display substrate, so that the brightness difference of the display screen is reduced, and the display quality is improved. It should be noted that, in practical applications, the shape of the light-emitting region of the display substrate and the division method of the light-emitting sub-regions can be set according to actual needs, which are not limited in the embodiments of the present disclosure. It should also be noted that some or all of the light-emitting sub-regions may include, for example, a plurality of double-sided light-emitting regions, in this case, part or all of the light-emitting sub-regions can be regarded as a light-emitting region, respectively, and the brightness compensation (for example, brightness compensation may be performed according to the maximum value or average value of local brightness gain data corresponding to plurality of double-sided light-emitting regions in the part or all of the light-emitting sub-regions) is performed on some or all of the light-emitting sub-regions according to the brightness compensation method described in the above-mentioned embodiments, and the embodiments of the present disclosure include but are not limited thereto.

For example, in still other examples, as illustrated by FIG. 6A to FIG. 6B, the light-emitting region of the display substrate may be divided into a plurality of light-emitting sub-regions corresponding to the plurality of double-sided light-emitting regions and a transition region between adjacent light-emitting sub-regions. In this case, as illustrated by FIG. 14, step S210 may include step S215: respectively determining the standard brightness information of the plurality of double-sided light-emitting regions according to the display data of the sub-pixels in the plurality of double-sided light-emitting regions. Step S220 may include step S225: respectively determining the local brightness gain data (that is, the local brightness gain data corresponding to the plurality of double-sided light-emitting regions are determined respectively, and the local brightness gain data corresponding to each of the double-sided light-emitting regions is the local brightness gain data of the light-emitting partition corresponding to each of the double-sided light-emitting regions) of the plurality of light-emitting sub-regions according to the standard brightness information and the sensing brightness information (the sensing brightness information of the plurality of double-sided light-emitting regions is provided by the plurality of optical sensing units respectively) of the plurality of double-sided light-emitting regions, and determining the local brightness-gain data of the transition region between the adjacent light-emitting sub-regions according to the local brightness gain data of the adjacent light-emitting sub-regions. Step S230 may include step S235: respectively performing brightness compensation on the plurality of light-emitting sub-regions according to the local brightness gain data of the plurality of light-emitting sub-regions; and performing brightness compensation on each of the transition regions according to the local brightness gain data of each of the transition regions. It can be understood that, in the case that the light-emitting region of the display substrate only includes different light-emitting sub-regions, there may be a problem that the display screen is visually partitioned due to large difference in the local brightness gain data of adjacent light-emitting partitions, and the setting of the transition regions and the brightness compensation method of the transition regions can avoid the above problems, so that the brightness difference of the display screen is further reduced, and the display quality is improved.

For example, in still other examples, individual brightness compensation can be performed on each of the sub-pixels in the light-emitting region of the display substrate in combination with a data accumulation algorithm. For example, the display device may include a data accumulation calculation unit for recording accumulated display information of each of the sub-pixels in the light-emitting region. In this case, as illustrated by FIG. 15, step S210 may include step S216: determining the standard brightness information of the at least one double-sided light-emitting region according to the display data of the sub-pixels in the at least one double-sided light-emitting region. Step S220 may include the following step S226A to step S226: step S226A, determining the degradation degree estimation data of each of the sub-pixels in the light-emitting region according to the accumulated display information of each of the sub-pixels in the light-emitting region; step S226B, determining the degradation degree calculation data of the sub-pixels in the at least one double-sided light-emitting region according to the standard brightness information and the sensing brightness information (the sensing brightness information of the at least one double-sided light-emitting region is provided by the at least one optical sensing unit, respectively) of the at least one double-sided light-emitting region; step S226C, determining the degradation degree correction data according to the degradation degree estimation data and the degradation degree calculation data of the sub-pixels in the at least one double-sided light-emitting region; step S226D, determining the degradation degree calculation data of each sub-pixel in the single-side light-emitting region according to the degradation degree estimation data of each of the sub-pixels in the single-side light-emitting region and the degradation degree correction data; and in step S226E, determining the individual brightness gain data of each of the sub-pixels in the light-emitting region according to the calculation data of the degradation degree of each of the sub-pixels in the light-emitting region. Step S230 may include step S236: performing brightness compensation (that is, individual brightness compensation) on each of the sub-pixels in the light-emitting region according to the individual brightness gain data of each of the sub-pixels in the light-emitting region. Therefore, targeted individual brightness compensation can be performed on each of the sub-pixels of the display substrate, so that the problem of abnormal display caused by the degradation of sub-pixels is alleviated, and the display quality is improved.

It should be noted that, for more details of the driving method provided by the embodiments of the present disclosure, it can refer to the corresponding descriptions in the above-mentioned embodiments of the display device, which will not be repeated herein.

It should be noted that, in the embodiments of the present disclosure, the flow of the above driving method may include more or less steps or operations, and these steps or operations may be performed sequentially or in parallel. Although the flow of the driving method mentioned above includes multiple steps or operations occurring in a specific order, it should be clearly understood that the order of the multiple steps or operations is not limited. The driving method mentioned above may be performed once, or may be performed multiple times according to pre-determined conditions.

For the technical effect of the driving method provided by the embodiment of the present disclosure, it can refer to the corresponding descriptions of the display device in the above-mentioned embodiment, which will not be repeated herein.

The following points required to be explained:

(1) the drawings of the embodiments of the present disclosure only relate to the structures related to the embodiments of the present disclosure, and other structures can refer to the general design.

(2) without conflict, the embodiments of the present disclosure and the features in the embodiments may be combined with each other to obtain new embodiments.

What are described above is related to only the illustrative embodiments of the present disclosure and not limitative to the protection scope of the present application. Therefore, the protection scope of the present application shall be defined by the accompanying claims.

The invention claimed is:

1. A display device, comprising:
a display substrate, comprising a light-emitting region and a plurality of pixel units located in the light-emitting region; wherein the light-emitting region comprises a single-sided light-emitting region and at least one double-sided light-emitting region, and each of the pixel units in the plurality of pixel units comprises a plurality of sub-pixels; and
at least one optical sensing unit, corresponding to the at least one double-sided light-emitting region from a non-display side of the display substrate, and configured to sense light emitted by the sub-pixels during operation in the at least one double-sided light-emitting region, and to provide sensing brightness information of the at least one double-sided light-emitting region to perform brightness compensation on the light-emitting region,
wherein each of the sub-pixels of the plurality of sub-pixels comprises a light-emitting element;
the light-emitting element in the single-sided light-emitting region comprises a first electrode, a first light-emitting functional layer and a second electrode that are stacked in sequence, the first electrode is closer to the non-display side than the second electrode, the first electrode is an opaque electrode, and the second electrode is a transparent electrode;
the light-emitting element in the at least one double-sided light-emitting region comprises a third electrode, a second light-emitting functional layer and a fourth electrode that are stacked in sequence, the third electrode is closer to the non-display side than the fourth electrode, at least a part of the third electrode is transparent, a transparent portion of the third electrode allows light emitted by the second light-emitting functional layer to pass through and to be emitted to the non-display side, and the fourth electrode is a transparent electrode.

2. The display device according to claim 1, further comprising:
a standard brightness determination unit, configured to determine standard brightness information of the at least one double-sided light-emitting region according to display data of the sub-pixels in the at least one double-sided light-emitting region;
a gain determination unit, configured to determine brightness gain data according to the standard brightness information and the sensing brightness information; and
a brightness compensation unit, configured to perform brightness compensation on the light-emitting region according to the brightness gain data.

3. The display device according to claim 2, wherein the at least one double-sided light-emitting region comprises a plurality of double-sided light-emitting regions, the at least one optical sensing unit comprises a plurality of optical sensing units, and the plurality of double-sided light-emitting regions correspond to the plurality of optical sensing units one by one.

4. The display device according to claim 3, wherein the gain determination unit is configured to determine the brightness gain data according to the standard brightness information and the sensing brightness information, comprising:
the gain determination unit is configured to:
determine a plurality of local brightness gain data according to the standard brightness information and the sensing brightness information of the plurality of double-sided light-emitting regions; and
use a maximum value or an average value of the plurality of local brightness gain data as the brightness gain data.

5. The display device according to claim 3, wherein the gain determination unit is configured to determine the brightness gain data according to the standard brightness information and the sensing brightness information, comprising:
the gain determination unit is configured to:
determine a plurality of local brightness difference data according to the standard brightness information and the sensing brightness information of the plurality of double-sided light-emitting regions;
take a maximum value or an average value of the plurality of local brightness difference data as the brightness difference data; and
determine the brightness gain data according to the brightness difference data.

6. The display device according to claim 3, wherein the light-emitting region comprises a plurality of light-emitting sub-regions corresponding to the plurality of double-sided light-emitting regions one by one;
the gain determination unit is configured to determine the brightness gain data according to the standard brightness information and the sensing brightness information, comprising:
the gain determination unit is configured to determine local brightness gain data of the plurality of light-emitting sub-regions according to the standard brightness information and the sensing brightness information of the plurality of double-sided light-emitting regions;
the brightness compensation unit is configured to perform brightness compensation on the light-emitting region according to the brightness gain data, comprising:
the brightness compensation unit is configured to perform brightness compensation on the plurality of light-emitting sub-regions respectively according to the local brightness gain data of the plurality of light-emitting sub-regions.

7. The display device according to claim 6, wherein the light-emitting region further comprises a transition region between adjacent light-emitting sub-regions;
the gain determination unit is configured to determine the brightness gain data according to the standard brightness information and the sensing brightness information, further comprising:
the gain determining unit is further configured to determine the local brightness gain data of the transition region according to the local brightness gain data of the adjacent light-emitting sub-regions;
the brightness compensation unit is configured to perform brightness compensation on the light-emitting region according to the brightness gain data, further comprising:
the brightness compensation unit is further configured to perform brightness compensation on the transition region according to the local brightness gain data of the transition region.

8. The display device according to claim 2, wherein the gain determination unit is configured to determine the brightness gain data according to the standard brightness information and the sensing brightness information, comprising:
the gain determination unit is configured to:
determine degradation degree estimation data of each of the sub-pixels in the light-emitting region according to accumulated display information of each of the sub-pixels in the light-emitting region;
determine degradation degree calculation data of the sub-pixels in the at least one double-sided light-emitting region according to the standard brightness information and the sensing brightness information of the at least one double-sided light-emitting region;
determine degradation degree correction data according to the degradation degree estimation data and the degradation degree calculation data of the sub-pixels in the at least one double-sided light-emitting region;
determine the degradation degree calculation data of each of the sub-pixels in the single-sided light-emitting region according to the degradation degree estimation data and the degradation degree correction data of each sub-pixel in the single-sided light-emitting region; and
determine individual brightness gain data of each of the sub-pixels in the light-emitting region according to the degradation degree calculation data of each of the sub-pixels in the light-emitting region;
the brightness compensation unit is configured to perform brightness compensation on the light-emitting region according to the brightness gain data, comprising:
the brightness compensation unit is configured to respectively perform brightness compensation on each of the sub-pixels in the light-emitting region according to the individual brightness gain data of each of the sub-pixels in the light-emitting region.

9. The display device according to claim 1, further comprising:
a sensing processor, configured to drive the at least one optical sensing unit to sense the light emitted by the sub-pixels in the at least one double-sided light-emitting region during operation, to obtain the sensing brightness information of the at least one double-sided light-emitting region.

10. The display device according to claim 9, further comprising: a bridge circuit board, wherein the at least one optical sensing unit is electrically connected with the sensing processor by the bridge circuit board.

11. The display device according to claim 9, wherein in a case that the display device comprises a standard brightness determination unit, a gain determination unit, and a brightness compensation unit, the standard brightness determination unit, the gain determination unit, and the brightness compensation unit are arranged in the sensing processor.

12. The display device according to claim 1, further comprising: a time controller; wherein in a case that the display device comprises a standard brightness determination unit, a gain determination unit and a brightness compensation unit, the standard brightness determination unit, the gain determination unit and the brightness compensation unit are arranged in the time controller.

13. The display device according to claim 1, wherein the at least one double-sided light-emitting region comprises a plurality of double-sided light-emitting regions, the plurality of double-sided light-emitting regions are uniformly distributed in the light-emitting region.

14. The display device according to claim 1, wherein for a light-emitting element in any one of the sub-pixels of the single-sided light-emitting region and a light-emitting element in one of the sub-pixels of the at least one double-sided light-emitting region that has a same light-emitting color as any one of the sub-pixels of the single-sided light-emitting region, the second electrode is substantially the same as the fourth electrode, the first light-emitting functional layer is substantially the same as the second light-emitting functional layer, except for the transparent portion, the third electrode is substantially the same as the first electrode; and a value range of a ratio of an area of the transparent portion of the third electrode to an area of the third electrode is 5% to 20%.

15. A driving method of a display device, wherein the display device comprises:

a display substrate, comprising a light-emitting region and a plurality of pixel units located in the light-emitting region, wherein the light-emitting region comprises a single-sided light-emitting region and at least one double-sided light-emitting region, each of the pixel units in the plurality of pixel units comprises a plurality of sub-pixels; and at least one optical sensing unit, corresponding to the at least one double-sided light-emitting region from the non-display side of the display substrate, configured to sense light emitted by the sub-pixels during operation in the at least one double-sided light-emitting region, and to provide the sensing brightness information of the at least one double-sided light-emitting region to perform brightness compensation on the light-emitting region;

the driving method comprises:

controlling the at least one optical sensing unit to sense the light emitted by the sub-pixels in the at least one double-sided light-emitting region during operation, and performing brightness compensation on the light-emitting region based on the sensing brightness information of the at least one double-sided light-emitting region, the display device further comprises:

a standard brightness determination unit, configured to determine standard brightness information of the at least one double-sided light-emitting region according to the display data of the sub-pixels in the at least one double-sided light-emitting region;

a gain determination unit, configured to determine brightness gain data according to the standard brightness information and the sensing brightness information; and a brightness compensation unit, configured to perform brightness compensation on the light-emitting region according to the brightness gain data;

performing brightness compensation on the light-emitting region according to the sensing brightness information of the at least one double-sided light-emitting region comprises:

determining standard brightness information of the at least one double-sided light-emitting region according to the display data of the sub-pixels in the at least one double-sided light-emitting region;

determining brightness gain data according to the standard brightness information and the sensing brightness information; and performing brightness compensation on the light-emitting region according to the brightness gain data, wherein the at least one double-sided light-emitting region comprises a plurality of double-sided light-emitting regions, the at least one optical sensing unit comprises a plurality of optical sensing units, and the plurality of double-sided light-emitting regions correspond to the plurality of optical sensing units one by one, and wherein determining the brightness gain data according to the standard brightness information and the sensing brightness information comprises:

determining a plurality of local brightness gain data according to the standard brightness information and the sensing brightness information of the plurality of double-sided light-emitting regions; and using a maximum value or an average value of the plurality of local brightness gain data as the brightness gain data.

16. A driving method of a display device, wherein the display device comprises:

a display substrate, comprising a light-emitting region and a plurality of pixel units located in the light-emitting region, wherein the light-emitting region comprises a single-sided light-emitting region and at least one double-sided light-emitting region, each of the pixel units in the plurality of pixel units comprises a plurality of sub-pixels; and at least one optical sensing unit, corresponding to the at least one double-sided light-emitting region from the non-display side of the display substrate, configured to sense light emitted by the sub-pixels during operation in the at least one double-sided light-emitting region, and to provide the sensing brightness information of the at least one double-sided light-emitting region to perform brightness compensation on the light-emitting region;

the driving method comprises:

controlling the at least one optical sensing unit to sense the light emitted by the sub-pixels in the at least one double-sided light-emitting region during operation, and performing brightness compensation on the light-emitting region based on the sensing brightness information of the at least one double-sided light-emitting region, the display device further comprises:

a standard brightness determination unit, configured to determine standard brightness information of the at least one double-sided light-emitting region according to the display data of the sub-pixels in the at least one double-sided light-emitting region;

a gain determination unit, configured to determine brightness gain data according to the standard brightness information and the sensing brightness information; and a brightness compensation unit, configured to perform brightness compensation on the light-emitting region according to the brightness gain data;

performing brightness compensation on the light-emitting region according to the sensing brightness information of the at least one double-sided light-emitting region comprises:

determining standard brightness information of the at least one double-sided light-emitting region according to the display data of the sub-pixels in the at least one double-sided light-emitting region;

determining brightness gain data according to the standard brightness information and the sensing brightness information; and performing brightness compensation on the light-emitting region according to the brightness gain data, wherein the at least one double-sided light-emitting region comprises a plurality of double-sided light-emitting regions, the at least one optical sensing unit comprises a plurality of optical sensing units, and the plurality of double-sided light-emitting regions correspond to the plurality of optical sensing units one by one, wherein determining the brightness gain data according to the standard brightness information and the sensing brightness information comprises:

determining a plurality of local brightness difference data according to the standard brightness information and the sensing brightness information of the plurality of double-sided light-emitting regions;

taking a maximum value or an average value of the plurality of local brightness difference data as the brightness difference data; and determining the brightness gain data according to the brightness e difference data.

* * * * *